United States Patent [19]

Nose et al.

[11] Patent Number: 5,148,038
[45] Date of Patent: Sep. 15, 1992

[54] DEVICE FOR DETECTING POSITIONAL RELATIONSHIP BETWEEN TWO OBJECTS

[75] Inventors: Noriyuki Nose, Machida; Naoto Abe, Isehara, both of Japan

[73] Assignee: Canon Kabushiki Kaisha, Tokyo, Japan

[21] Appl. No.: 804,514

[22] Filed: Dec. 10, 1991

Related U.S. Application Data

[63] Continuation of Ser. No. 684,497, Apr. 15, 1991, abandoned, which is a continuation of Ser. No. 404,106, Sep. 7, 1989, abandoned.

[30] Foreign Application Priority Data

Sep. 9, 1988 [JP] Japan .................. 63-225809
Sep. 9, 1988 [JP] Japan .................. 63-226006
Aug. 14, 1989 [JP] Japan .................. 1-209928

[51] Int. Cl.⁵ .................................. G01N 21/86
[52] U.S. Cl. ........................ 250/548; 356/401
[58] Field of Search ............ 250/548, 557; 356/400, 356/401

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 356/399 |
| 4,360,273 | 11/1982 | Thaxter | 356/354 |
| 4,398,824 | 8/1983 | Feldman et al. | 356/401 |
| 4,514,858 | 4/1985 | Novak | 378/34 |
| 4,539,482 | 9/1985 | Nose | 250/578 |
| 4,545,683 | 10/1985 | Markle | 356/400 |
| 4,629,313 | 12/1986 | Tanimoto | 356/401 |
| 4,636,626 | 1/1987 | Hazama et al. | 250/557 |
| 4,656,347 | 4/1987 | Une et al. | 250/548 |

FOREIGN PATENT DOCUMENTS 56-157033 12/1981 Japan .
61-111402 5/1986 Japan .
2073950 10/1981 United Kingdom .

OTHER PUBLICATIONS

Kinoshita, et al., "A Dual Grating Alignment Technique for X-ray Lithography", J. Vac. Sci. Tech. vol. B1, No. 4, Oct. 1983, pp. 1276–1279.

Primary Examiner—David C. Nelms
Attorney, Agent, or Firm—Fitzpatrick, Cella, Harper & Scinto

[57] ABSTRACT

A device for detecting a positional relationship between opposed first and second objects. The device includes a light source for projecting light to the first and second objects; a photodetecting system for detecting two lights from one of the first and second objects illuminated by the light from the light source, the photodetecting system detecting those two lights the position of incidence of each of which on a predetermined plane is changeable with the positional relationship between the first and second objects in a direction perpendicular to the direction in which the first and second objects are opposed; a position detecting system for detecting the positional relationship between the first and second objects in a direction perpendicular to the opposing direction of the first and second objects, on the basis of the relationship of the two lights, on the predetermined plane, as detected by the photodetecting system; and an interval detecting system for detecting the positional relationship between the first and second objects in the opposing direction, by using at least one of the two lights detected by the photodetecting system.

21 Claims, 30 Drawing Sheets

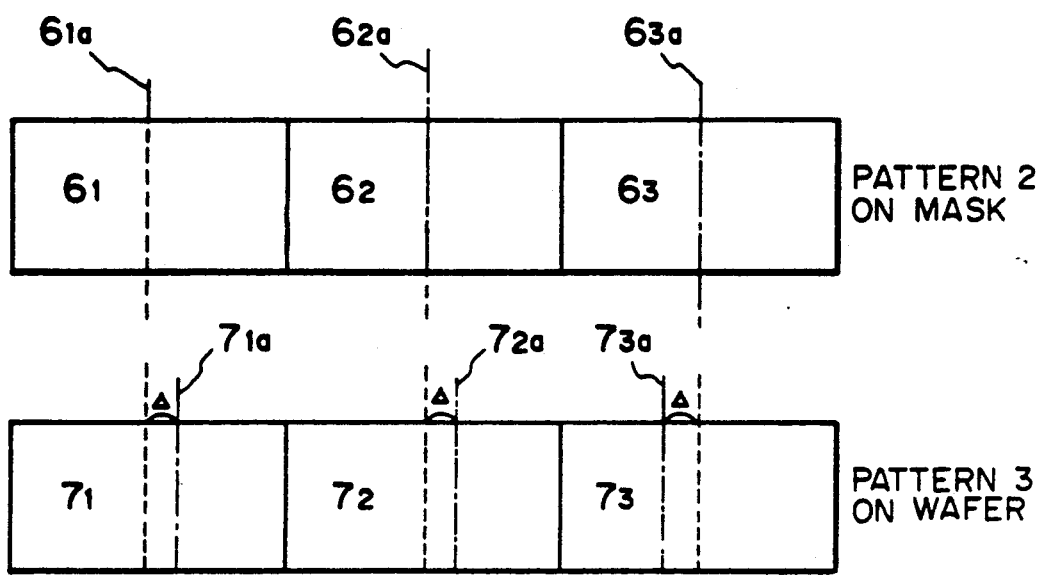
FIG. 6A
PATTERN 2 ON MASK
FIG. 6B
PATTERN 3 ON WAFER
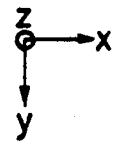
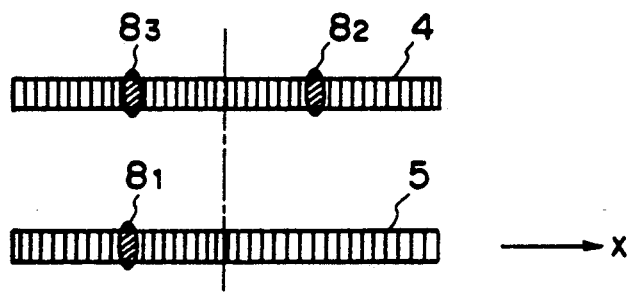
FIG. 7A
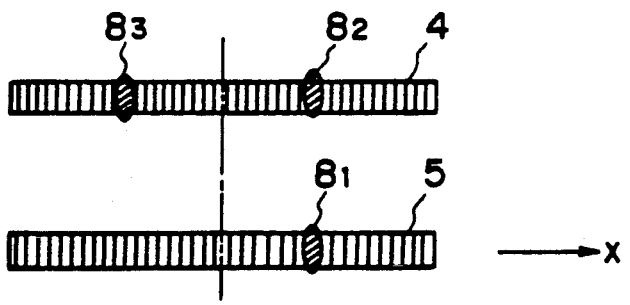
FIG. 7B

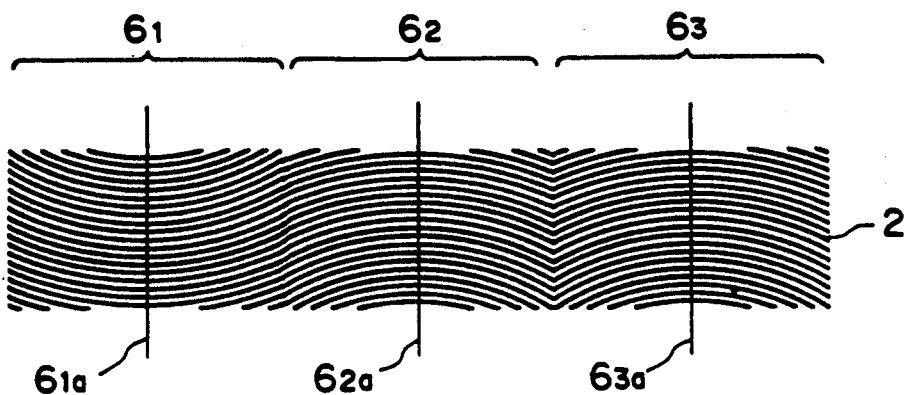
FIG. 8A
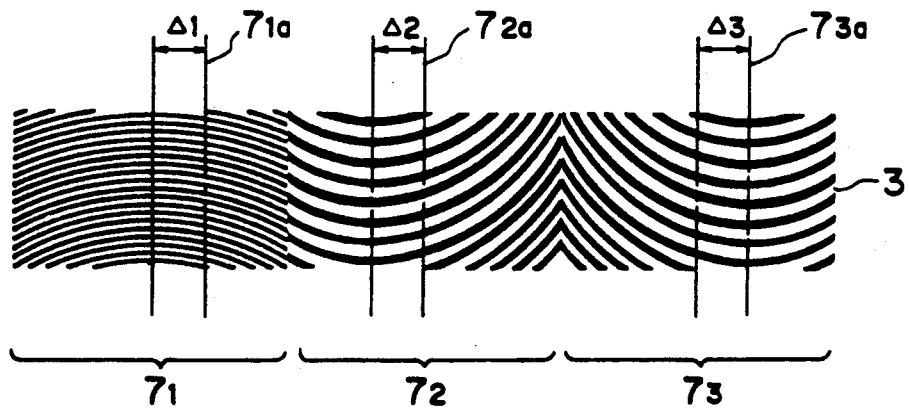
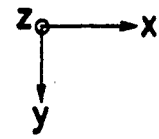
FIG. 8B

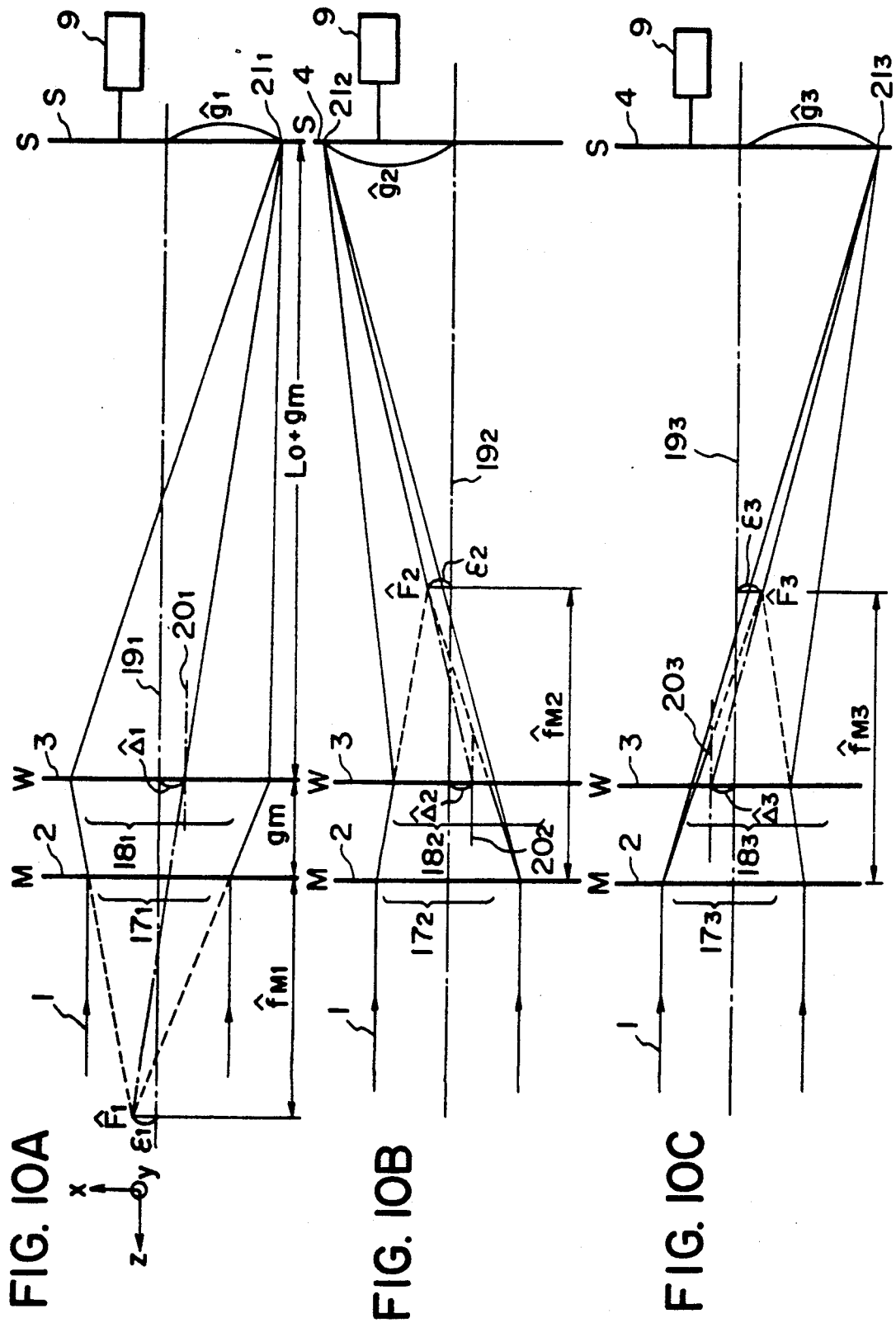

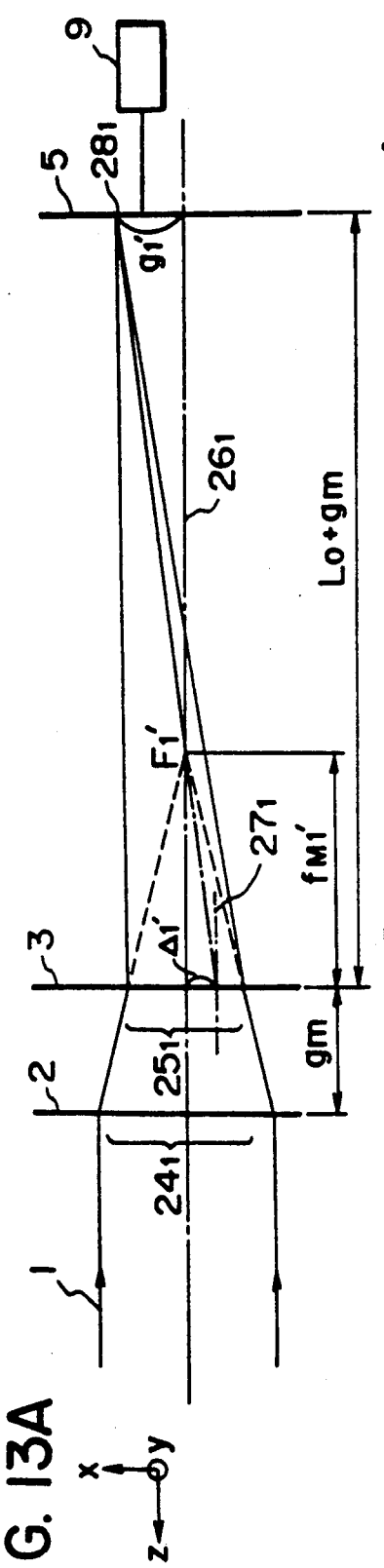
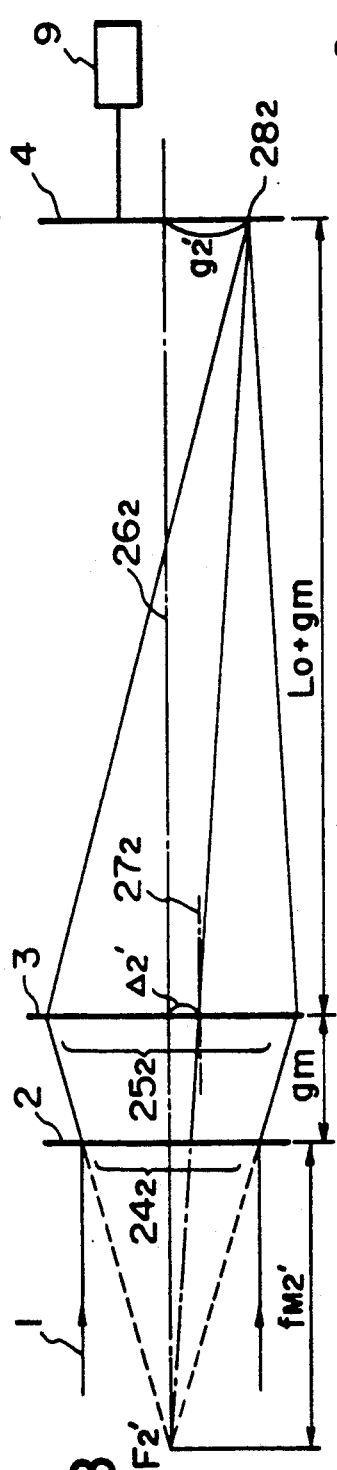
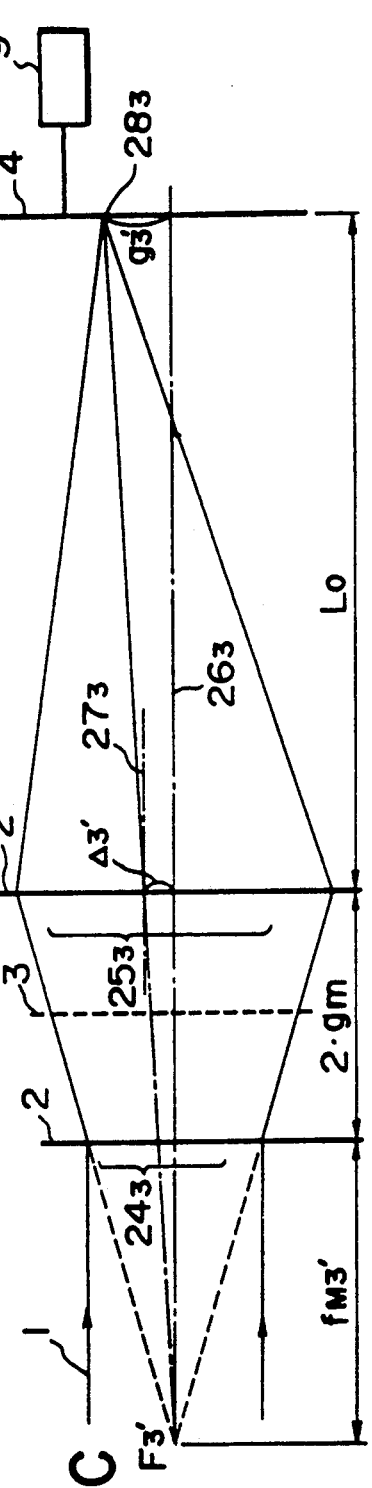
FIG. 13A
FIG. 13B
FIG. 13C

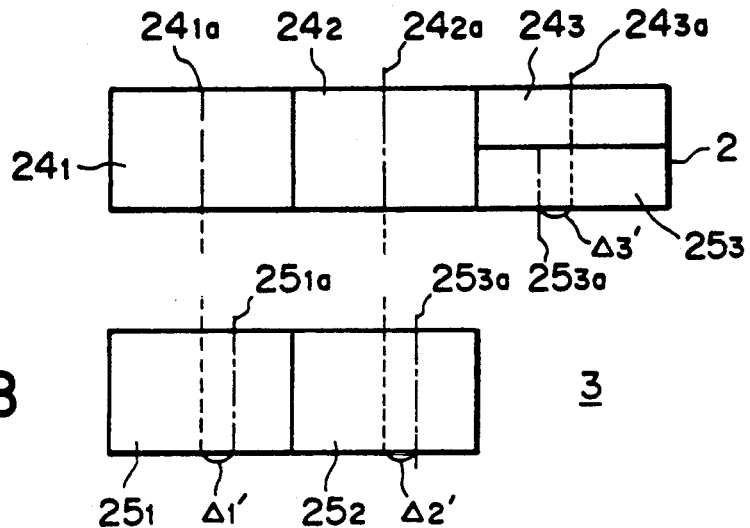
FIG. 14A
FIG. 14B
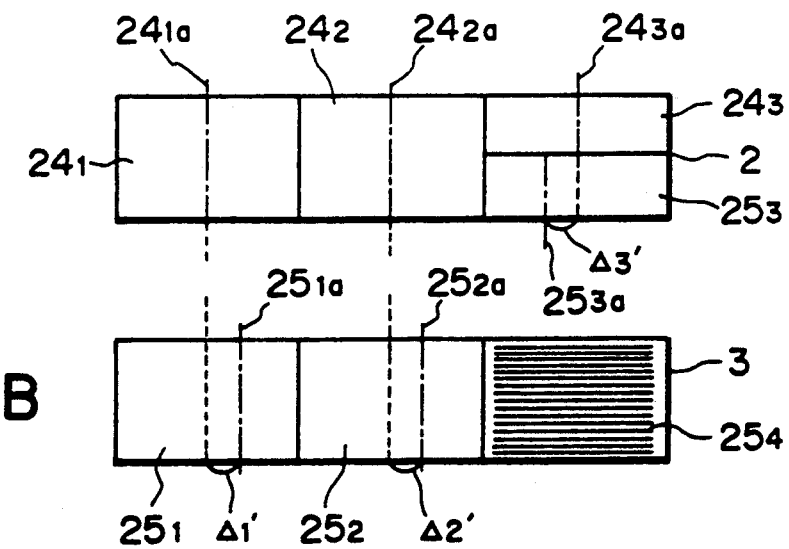
FIG. 15A
FIG. 15B

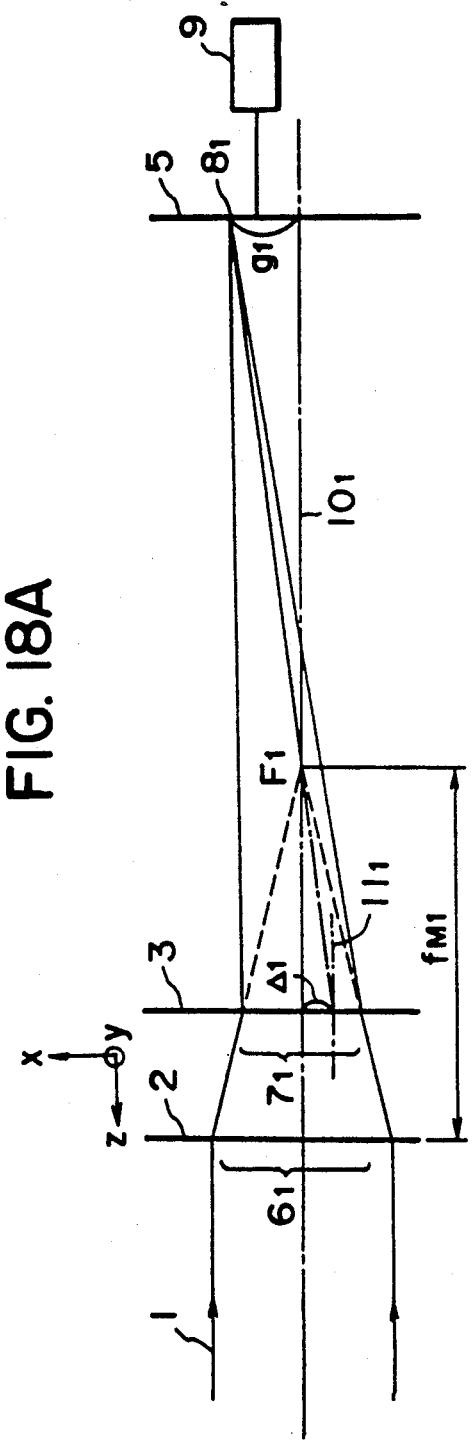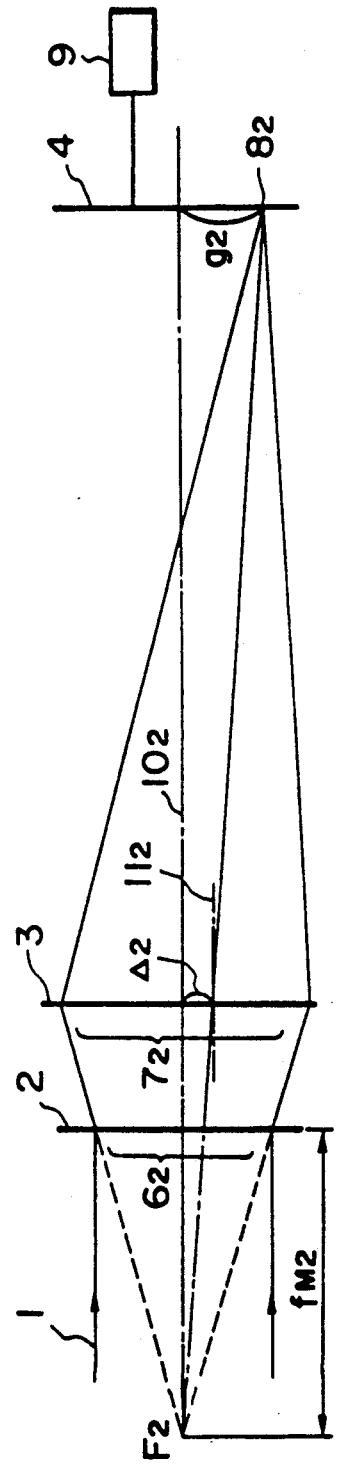

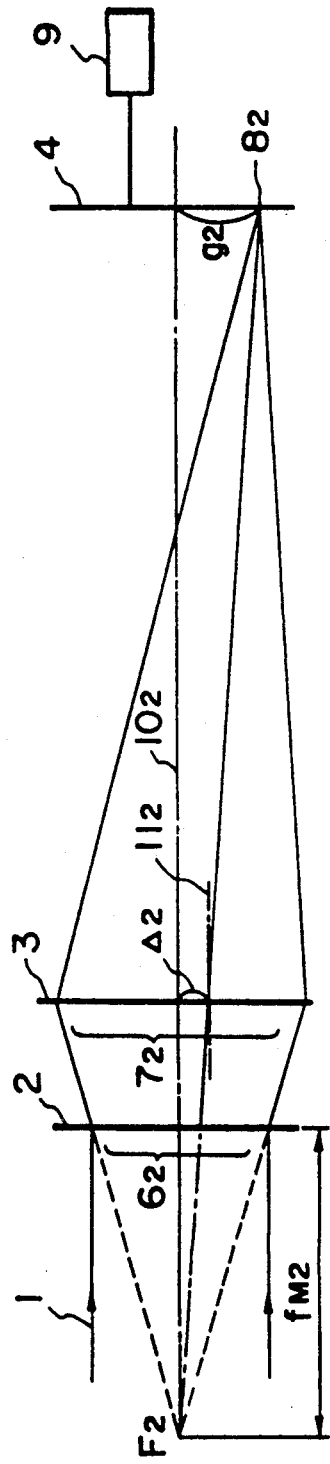
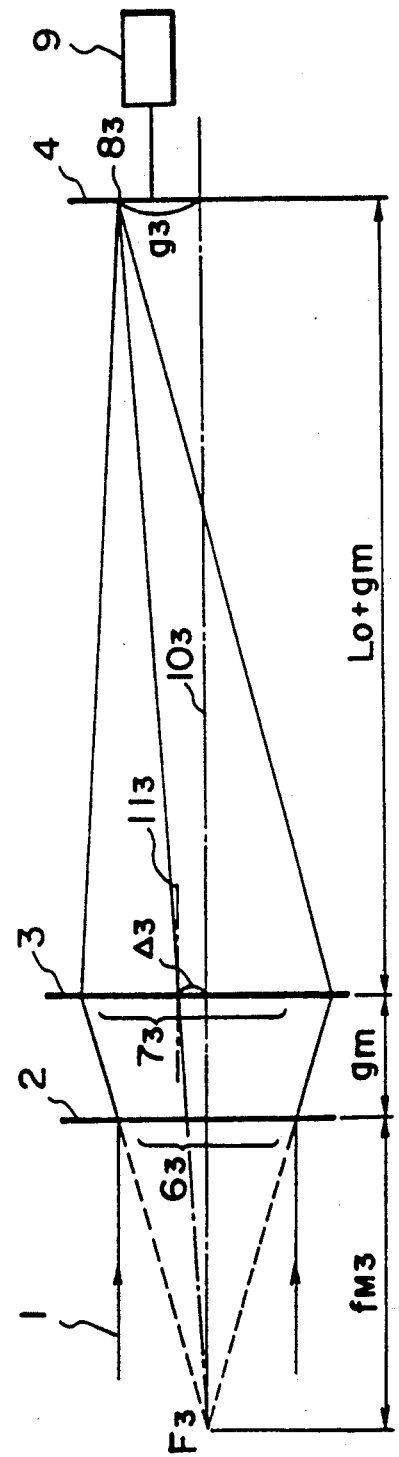
FIG. 19A
FIG. 19B

FIG.26B1 SPOT 1081

FIG.26B2 SPOT 1082

FIG.26B3 SPOT 1083

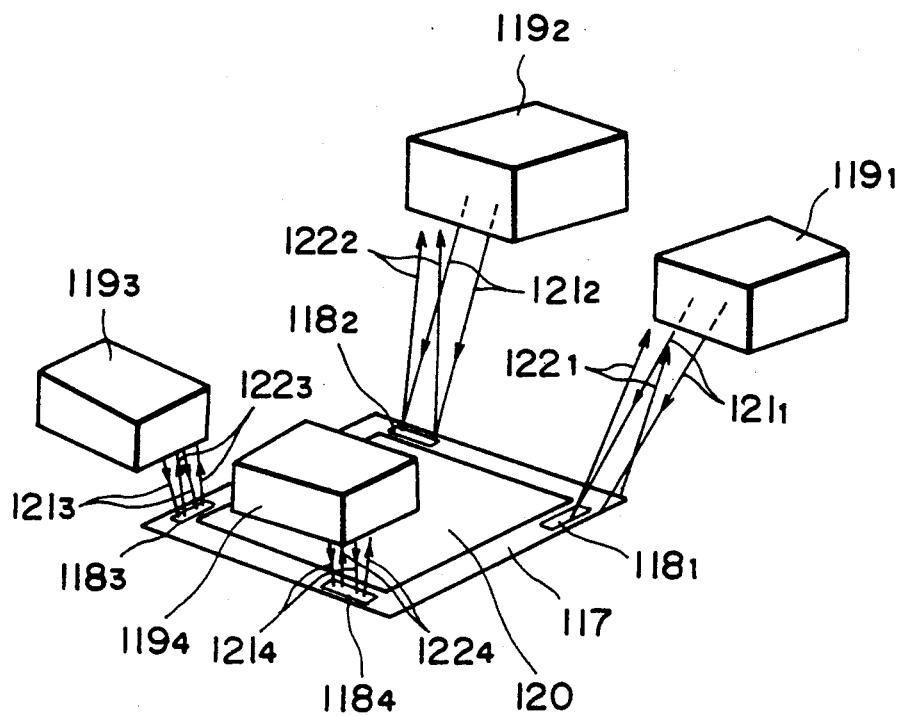
F I G. 29

DEVICE FOR DETECTING POSITIONAL RELATIONSHIP BETWEEN TWO OBJECTS

This application is a continuation of prior application Ser. No. 07/684,497, filed Apr. 15, 1991, which application is a continuation of prior application Ser. No. 07/404,106, filed Sept. 7, 1989, both now abandoned.

FIELD OF THE INVENTION AND RELATED ART

This invention generally relates to an alignment system for correctly positioning an object. More particularly, the invention is concerned with a method and apparatus suitably usable, for example, in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for measuring an interval between the mask and the wafer for controlling the same to a desired value, and also for detecting any positional deviation of the mask and the wafer for relatively positioning or aligning the mask and the wafer.

In exposure apparatuses for use in the manufacture of semiconductor devices, the relative alignment of a mask and a wafer is one important factor in respect to ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, an example a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68 in a direction along the mask or wafer surface (in a lateral direction in this case).

FIG. 3 is a schematic view of an interval measuring device of the type as proposed in Japanese Laid-Open Patent Application Sho 61-111402. In this Figure, a mask (first object) M and a wafer (second object) W are disposed opposed to each other, and by means of a lens L1, light is focused at a point Ps between the mask M and the wafer W.

Here, a portion of the light is reflected by the mask M surface and another portion is reflected by the wafer W surface, these lights are projected and focused through a lens L2 at points $P_W$ and $P_M$ on the surface of a screen S. The interval between the mask M and the wafer W is detected by detecting the spacing between the spots $P_W$ and $P_M$ of focused lights upon the screen S surface.

However, the structures shown in FIGS. 1 and 3 are completely different and if it is desired to detect both any lateral relative positional deviation between two objects and the interval therebetween, it is necessary that a lateral relative positional deviation detecting device and an interval measuring device are provided separately. This makes the whole structure bulky and complicated.

SUMMARY OF THE INVENTION

It is an object of the present invention to provide a method and apparatus for detecting a positional relationship between two objects, by which any relative positional deviation between the objects as well as the interval therebetween can be detected simultaneously, if desired, with a simple and compact structure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 6A and 6B are schematic views, showing an example of a pattern area in the FIG. 4 embodiment.

FIGS. 7A and 7B are schematic views, illustrating examples of distributed spots on sensors, in the FIG. 4 embodiment.

FIGS. 8A and 8B illustrate examples of patterns to be provided on a mask and a wafer, which are usable in the FIG. 4 embodiment.

FIGS. 10A, 10B and 10C are schematic representations, illustrating the principle of an apparatus according to a third embodiment of the present invention, wherein the optical paths are shown in an unfolded view.

FIGS. 13A, 13B and 13C are schematic representations, illustrating the principle of the apparatus of the FIG. 12 embodiment, wherein the optical paths are shown in an unfolded view.

FIGS. 14A and 14B are schematic views showing an example of a pattern area, in the FIG. 12 embodiment.

FIGS. 15A and 15B are schematic views showing another example of a pattern area in the FIG. 12 embodiment.

FIGS. 18A and 18B are schematic representations, illustrating the principle of an apparatus according to a seventh embodiment of the present invention, wherein the optical paths are shown in an unfolded view.

FIGS. 19A and 19B are schematic representations, illustrating the principle of an apparatus according to an eighth embodiment of the present invention, wherein the optical paths are shown in an unfolded view.

FIGS. 26A and 26B1, 26B2 and 26B3 are schematic representations, illustrating the principle of spot detection in accordance with the FIG. 20 embodiment.

FIG. 29 is a perspective view of an apparatus which may be arranged in accordance with the ninth or tenth embodiment.

DESCRIPTION OF THE PREFERRED EMBODIMENTS

Figure 4A:
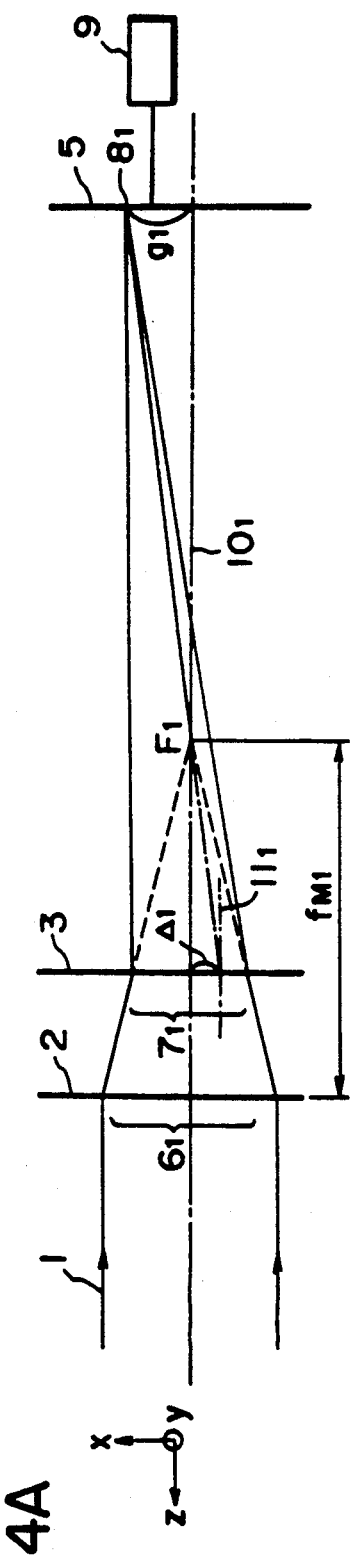
FIGS. 4A, 4B and 4C are schematic representations, illustrating the principle of an apparatus according to a first embodiment of the present invention, wherein the optical paths are shown in an unfolded view.
Figure 4B:
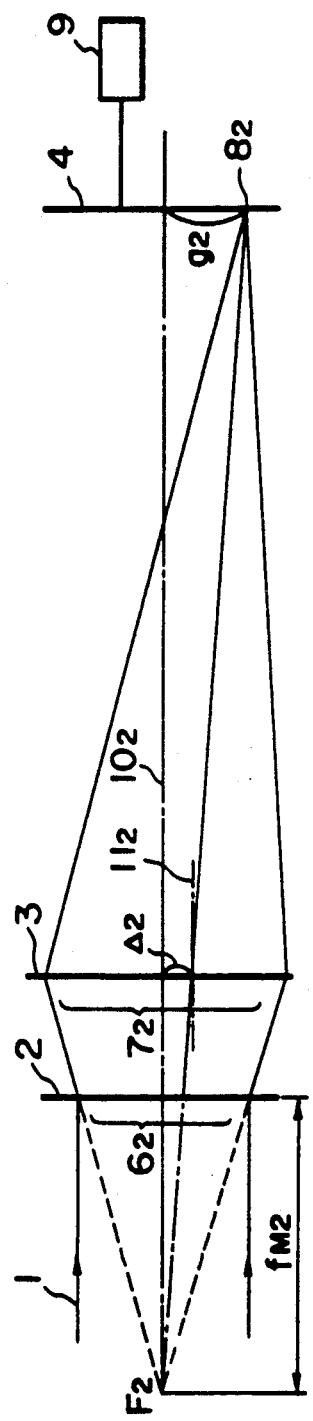
Figure 4C:
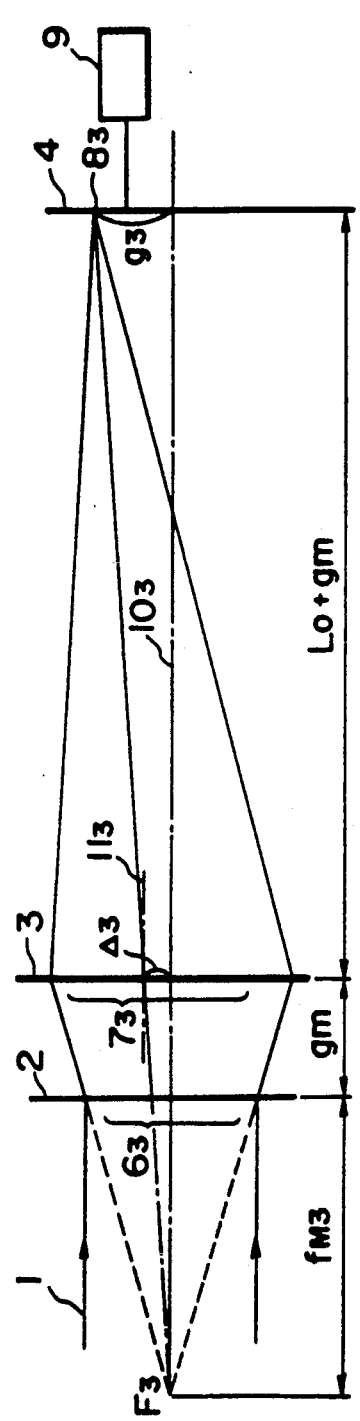
Figure 5:
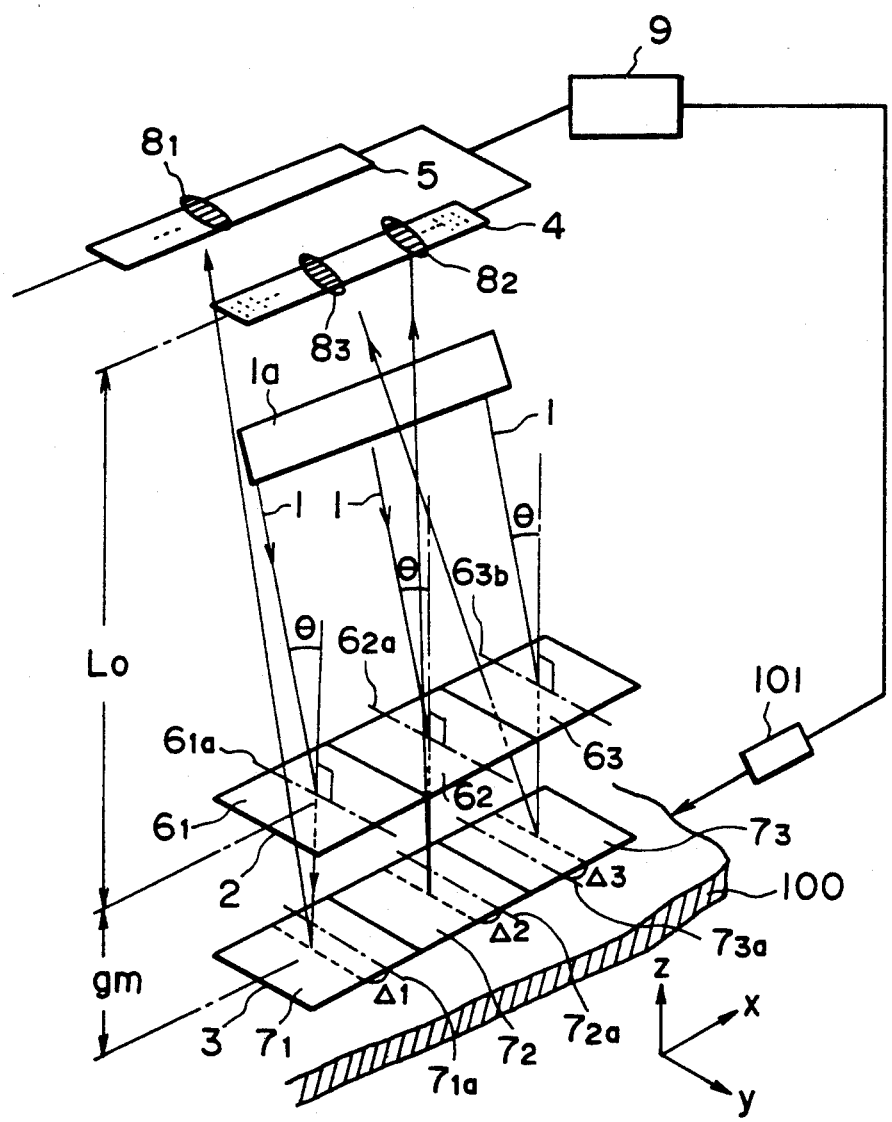
FIG. 5 is a perspective view of a major part of the FIG. 4 embodiment.

FIG. 4 is a schematic illustration of optical paths in a first embodiment of the present invention, and FIG. 5 is a perspective view showing a major part of an apparatus according to this embodiment.

In FIGS. 4 and 5, denoted at 1 is a light supplied from a light source 1a such as, for example, a He-Ne laser, a semiconductor laser or a light emitting diode (LED). A first object 2 is a mask, for example, and a second object 3 is a wafer, for example, which are disposed opposed to each other with a spacing gm. Physical optic elements $6_1$, $6_2$ and $6_3$ are each provided in a portion of the mask 2, while physical optic elements $7_1$, $7_2$ and $7_3$ are each provided in a portion of the wafer 3. Each of these physical optic elements $6_1$–$6_3$ and $7_1$–$7_3$ is formed by a Fresnel zone plate or a diffraction grating, for example. In the drawings, for better understanding, the mask 2 and the wafer 3 are illustrated as being provided only by these physical optic elements $6_1$–$6_3$ and $7_1$–$7_3$. Light receiving means 4 and 5 are placed each at a position spaced by $L_0$ from the mask 2. It is seen that FIG. 4 shows the state of a reflective diffraction light from the wafer 3, being illustrated in FIG. 5, and for convenience in explanation, the wafer 3 is illustrated as being a transmission type diffracting element (equivalent to a reflection type one) as viewed from the direction parallel to the mask 2 surface. Each of the light receiving means 4 and 5 comprises a line sensor, an area sensor or a position sensing diode (PSD), for example, and is adapted to detect the position of the center of gravity of each inputted light $8_1$, $8_2$ or $8_3$ as well as the spot configuration thereof. Here, the term "center of gravity of light" means such a point that, when in the cross-section of the light a position vector of each point in the section is multiplied by the light intensity of that point and the thus obtained products are integrated over the entire section, the integrated value has a "zero vector". As an alternative, the position of such a point at which the light intensity distribution has a peak may be detected and used.

Central processing unit (CPU) 9 uses the signals from the light receiving means 4 and 5 to detect, for example, the position of the center of gravity of each light $8_1$, $8_2$ or $8_3$ incident on the light receiving means 4 surface or the shape of the light spots formed thereon, to thereby determine by calculation the spacing gm between the mask 2 and the wafer 3 as well as any lateral deviation in the X-Y plane (i.e. alignment error) of the mask and the wafer, in the manner which will be described later. Wafer stage 100 carries thereon the wafer 3 and is adapted to move the same in each of X, Y and Z directions. Stage driver 101 is operable in response to an instruction signal based on the calculation made in the CPU 9, to actuate the wafer stage 100 for adjustment of the lateral position of the mask and the wafer as well as for setting the spacing therebetween. It will be understood that the situation illustrated in FIG. 5 is that, in regard to any positional deviation (alignment error) of the mask 2 and the wafer 3 in a direction contained in the X-Y plane (lateral direction), the deviation in one-dimensional direction (for example, one direction contained in that plane, namely, X direction in this example) is to be detected. Generally, the mask-and-wafer deviation cannot be determined unless three components $\Delta x$, $\Delta y$ and $\Delta \theta$ (two-dimensional and rotational deviation) are detected. So, four optical systems each having such a structure as shown in FIG. 5 may be provided at four corners of a rectangular area of a size of 15 mm, for example, in which a semiconductor circuit pattern should be printed. This arrangement allows detection of positional deviation in a plane, at four sites. From the data at least at three of them, the three parameters $\Delta x$, $\Delta y$ and $\Delta \theta$ can be detected. The manner of detection is well-known in the art and, therefore, description thereof will be omitted here.

The light receiving means 4 and 5 (and the CPU 9, if necessary) are made movable relatively to the mask 2 or the wafer 3.

In this embodiment, light 1 (whose wavelength $\lambda = 8300$ angstroms, for example) from a semiconductor laser 1a is incident upon a Fresnel zone plate (hereinafter which will be referred to also simply as "FZP") on the mask 2 surface, at an angle $\theta$ with respect to a normal to the mask surface, in the form of a plane wave. FIG. 4 shows details of diffraction of rays in FIG. 5, as viewed in a direction (Y direction) perpendicular to the lengthwise direction of the light receiving means 4 or 5, and illustrates the Fresnel zone plate $7_1$, $7_2$ and $7_3$ of the wafer 3 each being as a transmissive diffraction element which is equivalent to a reflectively diffracting type one. The distance between spots $8_1$ and $8_2$ (the spacing between the centers of gravities of these spots $8_1$ and $8_2$) bears the information concerning any deviation in the plane (alignment error) between the mask and the wafer, whereas the distance between spots $8_2$ and $8_3$ (the spacing between the centers of gravities of these spots $8_2$ and $8_3$) bears the information concerning the surface spacing gm.

In FIG. 4, the Fresnel zone plates $6_1$–$6_3$ on the mask 2 surface have their focal point positions at points $F_1$, $F_2$ and $F_3$, respectively. The zone plate $6_1$ is so patterned that it has a diffraction function, which may be equivalent to that of a convex lens, for producing a convergent first order diffraction light, whereas each of the zone plates $6_2$ and $6_3$ is so patterned that it has a diffraction function, which may be equivalent to that of a concave lens, for producing a divergent first order diffraction light. These first order diffraction lights impinge on the wafer 3 surface. The Fresnel zone plates $7_1$–$7_3$ on the wafer 3 are so patterned that the incident first order diffraction lights are reflectively diffracted by the zone plates $7_1$–$7_3$ and are focused on the detecting means 4 and 5, spaced from the wafer by $L_0+gm$, to form spots $8_1$, $8_2$ and $8_3$ of lights. Actually, the reflectively diffracted light from the wafer 3 goes through the mask 2 to the detecting means 4 or 5, as shown in FIG. 5. However, when it passes the mask 2, it simply passes therethrough without being diffracted, as in the form of what can be called a "zero-th order direct transmission light" which is non-diffracted.

The principle of measurement of a mask-and-wafer deviation in a plane (alignment error) as well as a surface spacing gm, by use of three sets of patterns provided by Fresnel zone plates on the mask 2 and the wafer 3 as having basic power arrangement such as described, will now be explained in greater detail with reference to FIGS. 4 and 5. In FIG. 4, the Fresnel zone plates $6_1$–$6_3$ and $7_1$–$7_3$ have respective optical axes $10_1$–$10_3$ and $11_1$–$11_3$ and, when the mask and the wafer are aligned correctly, the optical axes of the paired Fresnel zone plates have a mutual deviation $\Delta_1$, $\Delta_2$ or $\Delta_3$ such as shown in FIG. 4. In this example, $\Delta_1 \approx \Delta_2 \approx \Delta_3$, as will be described later. Further, $f_{M1}$ denotes the distance between the point $F_1$ and the mask 2 (the focal lengths of the FZP $6_1$ as a convex lens), $f_{M2}$ denotes the distance between the point $F_2$ and the mask 2 (the focal length of the FZP $6_2$ as a concave lens), and $f_{M3}$ denotes the distance between the point $F_3$ and the mask 2 (the focal length of the FZP $6_3$ as a concave lens). In this particular example, $f_{M2} \approx f_{M3}$, as will be described later.

It is now assumed that, when there is no alignment error and the surface spacing gm is correct, the spots of lights diffracted by the patterns (zone plates) $6_1$–$6_3$ of the mask 2 and the patterns (zone plates) $7_1$–$7_3$ of the wafer 3 are formed at positions $8_1$, $8_2$ and $8_3$, respectively, which are deviated from respective optical axes $10_1$, $10_2$ and $10_3$ of the corresponding zone plates through distances $g_1$, $g_2$ and $g_3$. The patterns $7_1$–$7_3$ of the wafer are designed so as to produce first order diffraction lights by which the points $F_1$ and $8_1$; the points $F_2$ and $8_2$; and the points $F_3$ and $8_3$ are in an optically conjugate relationship.

Here, the following relations are provided:

$$g_1 = \frac{L_0 + 2g_m - f_{M1}}{f_{M1} - g_m} \cdot \Delta_1 \qquad (1)$$

$$g_2 = \frac{L_0 + 2g_m + f_{M2}}{f_{M2} + g_m} \cdot \Delta_2 \qquad (2)$$

$$g_3 = \frac{L_0 + 2g_m + f_{M3}}{f_{M3} + g_m} \cdot \Delta_3 \qquad (3)$$

Next, the principle of measurement of the spacing between the mask 2 and the wafer 3 will be explained, taking by way of example the pairs of patterns $6_2$ and $7_2$; $6_3$ and $7_3$, shown at parts (B) and (C) of FIG. 4.

If in equations (2) and (3) $f_M \approx f_{M3}$ and $\Delta_2 \approx \Delta_3$, then equations (2) and (3) are substantially the same, and with a deviation between the mask and the wafer in the plane, the spacing (distance) between the spots $8_2$ and $8_3$ on the sensor surface is substantially unchanged. If, for example, the wafer 3 shifts upwardly by $\Delta\delta$ in FIG. 4, the deviation between optical axes in each pair changes to "$\Delta_2 - \delta$" or "$\Delta_3 + \delta$". From equations (2) and (3), the changes $\Delta g_2$ and $\Delta g_3$ in the spacing $g_2$ and $g_3$ can be expressed by:

$$\Delta g_2 = -\frac{L_0 + 2g_m + f_{M2}}{f_{M2} + g_m} \cdot \delta$$

$$\Delta g_3 = \frac{L_0 + 2g_m + f_{M3}}{f_{M3} + g_m} \cdot \delta$$

Since, $f_{M2} \approx f_{M3}$, $\Delta g_2 + \Delta g_3 \approx 0$. Therefore, the spacing between the spots $8_2$ and $8_3$ on the sensor surface is unchanged and, if the spacing between the optical axes $10_2$ and $10_3$ in the X direction is denoted by $1_2$, then it is $1_2 - (g_2 + g_3)$. Therefore, any positional deviation between the mask and the wafer in the X-Y plane (i.e., alignment error) does not result in a change in the spacing between two spots $8_2$ and $8_3$ on the sensor 4. As compared therewith, if the spacing $g_m$ between the mask and the wafer increases by an amount $\Delta z$, as will be seen from equations (2) and (3) there occur changes $\Delta g_2'$ and $\Delta g_3'$ in the spacings $g_2$ and $g_3$, which can be expressed by:

$$\Delta g_2' = -\frac{(L_0 - f_{M2})\Delta z \Delta_2}{(f_{M2} + g_m)(f_{M2} + g_m + \Delta z)}$$

$$\Delta g_3' = -\frac{(L_0 - f_{M3})\Delta z \Delta_3}{(f_{M3} + g_m)(f_{M3} + g_m + \Delta z)}$$

If $\Delta_2 \approx \Delta_3$ and $f_{M2} \approx f_{M3}$, then $$\Delta g_2' + \Delta g_3' = -\frac{2(L_0 - f_{M2})\Delta z \Delta_2}{(f_{M2} + g_m)(f_{M2} + g_m + \Delta z)}$$

Accordingly, with a change in the gap $g_m$, the spacing between the two spots $8_2$ and $8_3$ in the X direction changes, on the sensor 4 surface, from the value "$1_2 - (g_2 + g_3)$" assumed at the time of correct spacing. Namely, by using a combination of patterns as illustrated in parts (B) and (C) of FIG. 4, it is possible to detect the surface spacing between the mask and the wafer, independently of any positional deviation between the mask and the wafer in the plane.

A particular example will now be explained. If, for example, $f_{M2} = f_{M3} = 114.535$ microns
$L_0 = 18345.94$ microns
$\Delta_2 = \Delta_3 = 10$ microns then,

| $g_m$ | $g_2 = g_3$ |
|---|---|
| 61.5 microns | 1055.67 microns |
| 71.5 | 1000.0 |
| 81.5 | 950.0 |

If, therefore, in this case the surface spacing changes by 10 microns, from 71.5 microns to 61.5 microns, then the spacing between the spots $8_2$ and $8_3$ changes by 111.34 microns. If, therefore, the spacing of spots can be discriminated on the sensor 4 with a resolution of 1 micron, the change in the surface spacing between the mask 2 and the wafer 3 can be detected with a resolution of $10/111.34 = 0.09$ micron.

Taking the pairs of patterns $6_1$ and $7_1$; and $6_2$ and $7_2$ shown in parts (A) and (B) of FIG. 4, the principle of measurement of a positional deviation between the mask 2 and the wafer 3 in the X-Y plane (i.e. alignment error) will be explained. If the mask-and-wafer spacing $g_m$ changes and when $\Delta_1 \approx \Delta_2 = \Delta$, from equations (1) and (2), it follows that:

$$g_1 = \frac{L_0 + 2g_m - f_{M1}}{f_{M1} - g_m} \cdot \Delta \quad (1')$$

$$g_2 = \frac{L_0 + 2g_m - f_{M2}}{f_{M2} + g_m} \cdot \Delta \quad (2')$$

It will be understood from equations (1') and (2') as well as from parts (A) and (B) of FIG. 4, if there is a positional deviation (alignment error) between the mask and the wafer, in equations (1') and (2') an alignment error $\delta$ is added to $\Delta$, such that changes $\Delta g_1$ and $\Delta g_2$ in the spacings $g_1$ and $g_2$ are:

$$\Delta g_1 = -\frac{L_0 + 2g_m - f_{M1}}{f_{M1} - g_m} \cdot \delta \quad (1'')$$

$$\Delta g_2 = -\frac{L_0 + 2g_m + f_{M2}}{f_{M2} + g_m} \cdot \delta \quad (2'')$$

and $$\Delta g_1 + \Delta g_2 = -2\delta\left(\frac{L_0 + 2g_m + f_{M2}}{f_{M2} + g_m} + \frac{L_0 + 2g_m - f_{M1}}{f_{M1} - g_m}\right)$$

Therefore, in accordance with the value of $\delta$, the distance between the spots $8_1$ and $8_2$ on the sensors 4 and 5 in respect to the lengthwise direction of the sensor, changes. When the spacing between the optical axes $10_1$ and $10_2$ in the X direction is denoted by $1_1$, then, the spacing between the spots changes from a value "$1_1 + (g_1 + g_2)$" as assumed at the time of correct alignment of the mask and the wafer. Also, in regard to the combination of the Fresnel zone plates shown at parts (A) and (B), namely the combination of zone plates $6_1$ and $7_1$; and $6_2$ and $7_2$, a slight change in the surface spacing $g_m$ between the mask and the wafer causes only a small amount of change in the spacing between the spots $8_1$ and $8_2$ on the sensors 4 and 5 and, for this reason, it is possible to detect the positional deviation (alignment error) in the X-Y plane substantially independently of a change in the surface spacing. Namely, if the spacing $g_m$ between the mask and the wafer increases by $\Delta z$, the sum of deviations $g_1'$ and $g_2'$ of the spots at this time can be such as follows:

$$g_1' + g_2' = \frac{L_0 + 2(g_m + \Delta z) - f_{M1}}{f_{M1} - (g_m + \Delta z)} \cdot \Delta +$$

$$\frac{L_0 + 2(g_m + \Delta z) + f_{M2}}{f_{M2} - (g_m + \Delta z)} \cdot \Delta =$$

$$g_1 + g_2 + \frac{\Delta z(2 + M)}{f_{M1} - g_m - \Delta z} \cdot \Delta + \frac{\Delta z(2 - N)}{f_{M2} + g_m + \Delta z} \cdot \Delta$$

wherein
$M = (L_0 + 2g_m - f_{M1})/(f_{M1} - g_m)$ and
$N = (f_{M2} + 2g_m + L_0)/(f_{M2} + g_m)$.
If, $$f_{M1} = \frac{M+2}{M+1} g_m + \frac{L_0}{M+1} \approx g_m + \frac{L_0}{M+1}$$

$$f_{M2} = -\frac{N-2}{N-1} g_m + \frac{L_0}{N-1} \approx -g_m + \frac{L_0}{N-1}$$

then, $$g_1' + g_2' = g_1 + g_2 + \frac{\Delta z(2 + M)}{\frac{L_0}{M+1} - \Delta z} \cdot \Delta + \frac{\Delta z(2 - N)}{\frac{L_0}{N-1} + \Delta z} \Delta$$

If $L_0$ is sufficiently large, it can be considered that $\Delta z/L_0 \approx 0$ and, additionally, $|(M-N)/(M+N)| << 1$. Therefore, it can be considered that $g_1' + g_2' \approx g_1 + g_2$. Accordingly, the spacing between the spots $8_1$ and $8_2$ in the X direction can be unchanged with a change in the spacing.

A particular example of this will be explained below. If,
$f_{M1} = 253.85$ microns
$f_{M2} = 114.535$ microns
$\Delta_1 = \Delta_2 = 10$ microns
$L_0 = 18345.94$ microns
then, the spacing $g_1$, from the optical axis $10_1$, of the spot $8_1$ resulting from the combination of patterns illustrated at part (A), namely the combination of patterns $6_1$ and $7_1$, is such as follows:

| gm | $g_1$ |
|---|---|
| 66.5 microns | 972.78 microns |
| 71.5 | 1000.0 |
| 76.5 | 1028.76 |

On the other hand, the spacing $g_2$, from the optical axis $10_2$, of the spot $8_2$ resulting from the combination of patterns illustrated at part (B), namely, the combination of patterns $6_2$ and $7_2$, is such as follows:

| gm | $g_2$ |
|---|---|
| 66.5 microns | 1027.06 microns |
| 71.5 | 1000.0 |
| 76.5 | 974.35 |

The relationship between $g_1 + g_2$ and gm is such as follows:

| gm | $g_1 + g_2$ |
|---|---|
| 66.5 microns | 1999.84 microns |
| 71.5 | 2000.0 |
| 76.5 | 2003.11 |

Further, when the surface spacing gm is maintained constant at a value 71.5 microns and if there occurs a positional deviation $\delta$ between the mask and the wafer, then $g_1$ and $g_2$ are such as follows:

| $\delta$ | $g_1$ | $g_2$ | $g_1 + g_2$ |
|---|---|---|---|
| +5 μm | 500.0 μm | 500.0 μm | 1000.0 μm |
| 0 | 1000.0 | 1000.0 | 2000.0 |
| −5 | 1500.0 | 1500.0 | 3000.0 |

Namely, if there occurs a positional deviation $\delta$ between the mask and the wafer in the X-Y plane, the spacing between the spots $8_1$ and $8_2$ on the sensors 4 and 5 changes. For a positional deviation of 5 microns, for example, the spacing between the spots $8_1$ and $8_2$ changes by 1000 microns. Thus, the positional deviation can be detected in the form of spot displacement on the sensor surface of an amount two-hundred times larger than the positional deviation. Accordingly, if the spacing between the spots on the sensors 4 and 5 can be detected with a resolution of 2 microns, then it is possible to detect the mask-to-wafer deviation with a resolution of $2/200 = 0.01$ micron.

As compared therewith, if the gap between the mask and the wafer changes by 5 microns, from 71.5 microns to 66.5 microns, the change in the spacing between the spots $8_1$ and $8_2$ is only 0.16 micron, which is smaller than the resolution of 2 microns and can be disregarded without causing inconveniences. The spacing "$1_1 + (g_1 + g_2)$" between these spots $8_1$ and $8_2$ at the time of correct alignment of the mask and the wafer, as well as the spacing "$1_2 - (g_2 + g_3)$" between the spots $8_2$ and $8_3$ at the time of correct mask-to-wafer gap, can be determined in accordance with design values. However, they may be detected by trial printing.

Since each of the Fresnel zone plate $6_1 - 6_3$ and $7_1 - 7_3$ shown in FIG. 5 has a lens function in respect to both the X direction and the Y direction, any relative displacement between the mask 2 and the wafer 3 in the Y direction causes displacement of the spots $8_1$, $8_2$ and $8_3$ in the widthwise direction of the line sensor 4 or 5, by an amount corresponding to the amount of relative displacement. In consideration of this, each of the line sensors 4 and 5 has a sufficient width to ensure that, even with the possible largest deviation of the mask 2 and the wafer 3 in the Y direction, any one of the spots $8_1$, $8_2$ and $8_3$ does not go out of the sensor. In place of the line sensors, an area sensor having a sufficient width in the Y direction may be used to detect the spots $8_1 - 8_3$.

Each of the Fresnel zone plates $6_1 - 6_3$ and $7_1 - 7_3$ may comprise a lens having a power only in the lengthwise direction (X direction) of the line sensor 4 or 6, such as, for example, an FZP having a diffraction function like that of a cylindrical lens. In such case, if the mask and the wafer are relatively deviated in the Y direction which is perpendicular to the lateral deviation detecting direction (the lengthwise direction of the line sensor, i.e., X direction), the spots $8_1$, $8_2$ and $8_3$ on the sensors 4 and 5 do not shift in the widthwise direction of the sensor. In this case, any deviation between planes each containing the focal point of the corresponding FZP and a line parallel to the focal line of that FZP and passing through the center of the pattern, is taken as $\Delta$.

As described hereinbefore, the combination of FZP patterns illustrated in FIGS. 4 and 5 is provided on the mask and wafer, and by using part (A) and (B) any lateral positional deviation can be detected while, on the other hand, by using parts (B) and (C), the spacing can be measured. The spacing detection has substantially no dependence upon the lateral positional deviation and, on the other hand, the detection of lateral positional deviation has substantially no dependence on the spacing. Additionally, both the alignment detection and the surface spacing detection can be made at high precision. Further, if there occurs wafer tilt (inclination of wafer), since the detection of any positional deviation in the X-Y plane and the detection of the surface spacing are based on the information regarding the spacing of two spots, the spacing of these spots does not change by the wafer tilt. Therefore, the wafer tilt does not result in a detection error.

Further, if the light projecting system (light source $1a$ in this example) for the inputted light 1 or the alignment and gap detecting system, holding the sensors 4 and 5, is relatively deviated by a small amount (for example, 10-20 microns) relatively to the mask 2 and the wafer 3, there does not occur an error because any positional deviation in the X-Y plane (lateral positional deviation) is detected on the basis of the spacing between the spots $8_1$ and $8_2$ and the surface spacing between the mask and the wafer is detected on the basis of the spacing between the spots $8_2$ and $8_3$.

FIG. 6 illustrates, as an example, the relationship between (i) pattern areas for the patterns of the mask and the wafer, when the mask and the wafer are aligned with each other, and (ii) those lines which contain the optical axes of the patterns and which are parallel to the Y axis (in this example, the lines $6_{1a}$, $6_{2a}$, $6_{3a}$, $7_{1a}$, $7_{2a}$ and $7_{3a}$). Actually the pattern areas of the mask and the wafer are superposed in respect to the Z direction. However, in FIG. 6, they are illustrated as being relatively shifted in the Y direction, for convenience in illustration.

FIG. 7, parts (A) and (B), illustrates examples of the manner of formation of signal spot lights $8_1$, $8_2$ and $8_3$ on the photodetecting means 4 and 5 at the time of the setting of the spacing, on an occasion when there is no lateral positional deviation between the mask and the wafer. In any case, the spacing between the spots $8_1$ and $8_3$ and the spacing between spots $8_3$ and $8_2$, in the X direction, are detected. While FIG. 7 illustrates examples wherein light spots are formed on two line sensors, as a matter of course the arrangement may be such that light spots $8_1$-$8_3$ are formed and arrayed on one line sensor. FIG. 8 shows, as an example, FZP patterns usable in the first embodiment, as well as the relationship of the pattern areas. The detecting direction lies in the lateral direction as viewed in the drawing, i.e., X direction.

Figure 9A:
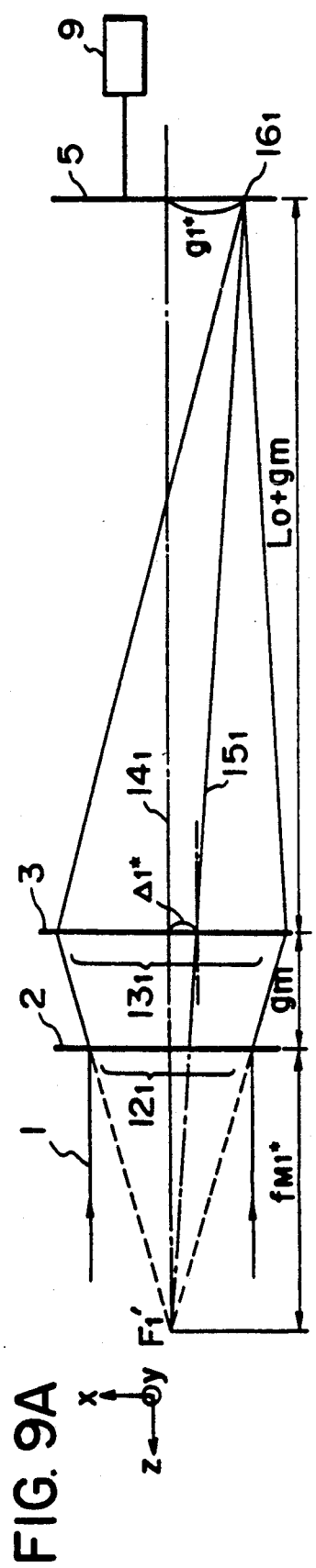
FIGS. 9A, 9B and 9C are schematic representations, illustrating the principle of an apparatus according to a second embodiment of the present invention, wherein the optical paths are shown in an unfolded view.
Figure 9B:
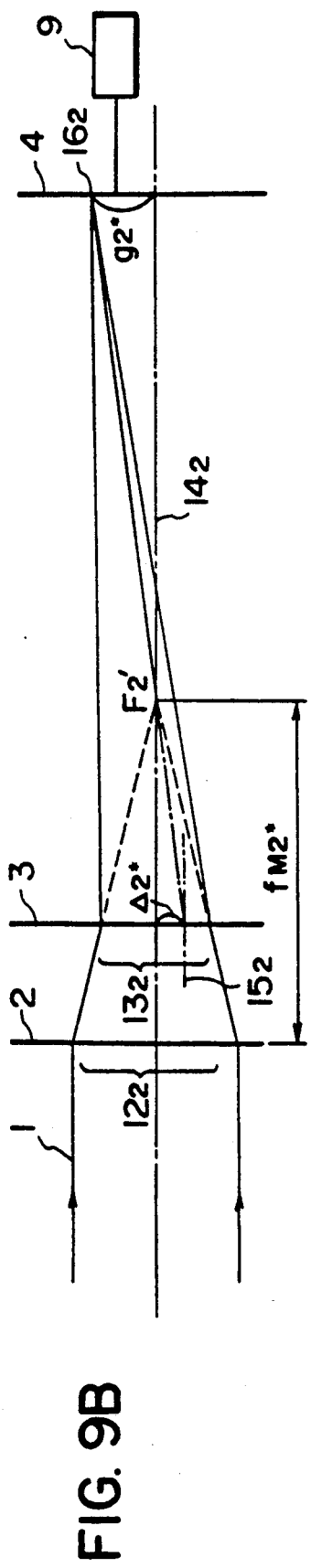
Figure 9C:
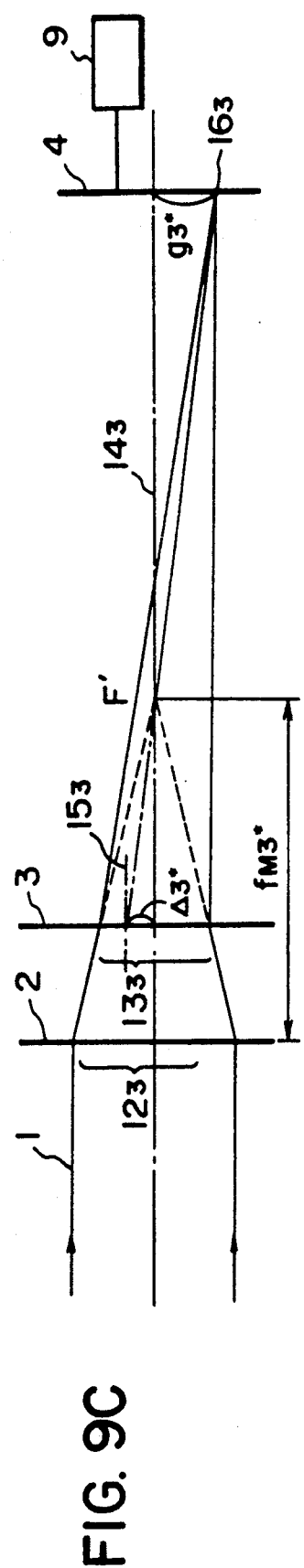

FIG. 9 illustrates another embodiment. In part (A) of FIG. 9, the diffraction function of each FZP is such that: an FZP $12_1$ on the mask has a diverging function and an FZP $13_1$ on the wafer has a converging function. In part (B), an FZP $12_2$ on the mask has a converging function and an FZP $13_2$ on the wafer has a diverging function. In part (C), an FZP $12_3$ on the mask has a converging function and an FZP $13_3$ on the wafer has a diverging function. Considering these zone plates as lenses, part (A) corresponds to a combination of concave and convex lenses, part (B) corresponds to a combination of convex and concave lenses, and part (C) corresponds to a combination of convex and concave lenses. The optical axes $15_1$, $15_2$ and $15_3$ of the patterns of the Fresnel zone plates on the wafer are set to be shifted relative to and parallel to the optical axes $14_1$, $14_2$ and $14_3$ of the Fresnel zone plates of the mask, by $\Delta_1^*$, $\Delta_2^*$ and $\Delta_3^*$ in the illustrated direction.

Where $g_1^*$, $g_2^*$ and $g_3^*$ denote the distances of spots $16_1$, $16_2$ and $16_3$ formed on the sensors 4 and 5, from the optical axes of the mask patterns, when the mask and the wafer have no alignment error and the spacing therebetween is correct, and $f_{M1}^*$, $f_{M2}^*$ and $f_{M3}^*$ denote the distances to the focal point positions $F_1'$, $F_2'$ and $F_3'$ of the Fresnel zone plates $12_1$, $12_2$ and $12_3$, respectively, then equations similar to equations (1), (2) and (3) are obtainable. That is, $$g_1^* = \frac{L_0 + 2g_m + f_{M1}^*}{f_{M1}^* + g_m} \cdot \Delta_1^* \qquad (4)$$

$$g_2^* = \frac{L_0 + 2g_m - f_{M2}^*}{f_{M2}^* - g_m} \cdot \Delta_2^* \qquad (5)$$

$$g_3^* = \frac{L_0 + 2g_m - f_{M3}^*}{f_{M3}^* - g_m} \cdot \Delta_3^* \qquad (6)$$

Therefore, in a similar manner as in the embodiment described with reference to FIGS. 4 and 5, it is possible to detect any deviation between the mask and the wafer in the X-Y plane (i.e. lateral positional deviation) by detecting the spacing between the sots $16_1$ and $16_2$ by using detection systems shown in parts (A) and (B), while it is possible to measure the surface spacing $g_m$ between the mask and the wafer by detecting the spacing between the spots $16_2$ and $16_3$ by using the detection systems shown in parts (B) and (C).

FIG. 10 shows another embodiment wherein each of Fresnel zone plates $17_1$, $17_2$ and $17_3$ of a mask has a refracting function in respect to the X direction, in addition to the light converging (or diverging) function. In this case, the spacing between (i) a spot $21_1$ formed on a photodetector 5 by the combination of patterns of the FZP $17_1$ and an FZP $18_1$ and (ii) a spot $21_2$ formed on a photodetector 4 by a combination of patterns of the FZP $17_2$ and an FZP $18_2$, is used for the detection of any positional deviation (lateral positional deviation) between the mask and the wafer in the X-Y plane. On the other hand, the spacing between spots $21_3$ and $21_2$ formed on the photodetector 4 by the combination of patterns of the FZP $17_3$ and an FZP $18_3$, is used for the detection of the surface spacing between the mask and the wafer. In this case, as shown in FIG. 10, the patterns $17_1$-$17_3$ of the mask are designed so that their focal point positions $F_1$, $F_2$ and $F_3$ are made eccentric as illustrated in FIG. 10 by $\epsilon_1$, $\epsilon_2$ and $\epsilon_3$ with respect to the optical axes $19_1$, $19_2$ and $19_3$ of these patterns. The respective focal lengths are denoted by $\hat{f}_{M1}$, $\hat{f}_{M2}$ and $\hat{f}_{M3}$. Reference the $20_1$, $20_2$ and $20_3$ denote the optical axes of the zone plates $18_1$, $18_2$ and $18_3$, respectively. The spots of lights from the FZP patterns of the mask and the wafer are formed on the sensors 4 and 5, at distances $\hat{g}_1$, $\hat{g}_2$ and $\hat{g}_3$ from the optical axes $19_1$, $19_2$ and $19_3$ of the mask patterns $17_1$, $17_2$ and $17_3$, respectively, in the directions and at positions as illustrated in FIG. 10. Here, $$\hat{g}_1 = \frac{L_0 + g_m}{f_{M1} + g_m} (\epsilon_1 + \hat{\Delta}_1) + \hat{\Delta}_1 \qquad (7)$$

$$\hat{g}_2 = \frac{L_0 + g_m}{f_{M2} - g_m} (\epsilon_2 + \hat{\Delta}_2) - \hat{\Delta}_2 \qquad (8)$$

-continued $$\hat{g}_3 = \frac{L_0 + g_m}{f_{M3} - g_m}(\epsilon_3 + \hat{\Delta}_3) - \hat{\Delta}_3 \quad (9)$$

Also in this case, by using the relations given by equations (7), (8) and (9), the lateral positional deviation (deviation in the X-Y plane) is detected on the basis of the combination of detection systems (A) and (B) while the surface spacing is measured on the basis of the combination of the detection systems (B) and (C), like the embodiments shown in FIGS. 4 and 9.

In each of the embodiments described hereinbefore, three sets of FZP patterns are provided on a mask and a wafer, and one of these sets is used both for the detection of lateral positional deviation and for measurement of the surface spacing. Each of the other two sets is used only for the detection of the lateral positional deviation or for the measurement of the surface spacing. For example, in the embodiments shown in FIGS. 4, 9 and 10, a set of Fresnel zone plates of the mask and the wafer as illustrated in part (B) are used both for the detection of lateral positional deviation and for detection of the surface spacing. On the other hand, the set of mask and wafer Fresnel zone plates shown in part (A) are used for detection of the lateral position, whereas a combination of the mask and wafer Fresnel zone plates shown in part (C) are used for the detection of the surface spacing. In practical use, it is sufficient that at least one set of mask and wafer patterns are used in common for the detection of an alignment error and for detection of the surface spacing. Further, the disposition of a pattern area on the mask is not limited to the example shown in FIG. 6.

Figure 11A:
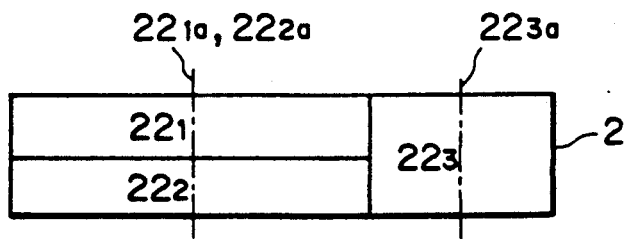
FIGS. 11A and 11B are schematic views, showing an example of a pattern area in the FIG. 10 embodiment.
Figure 11B:
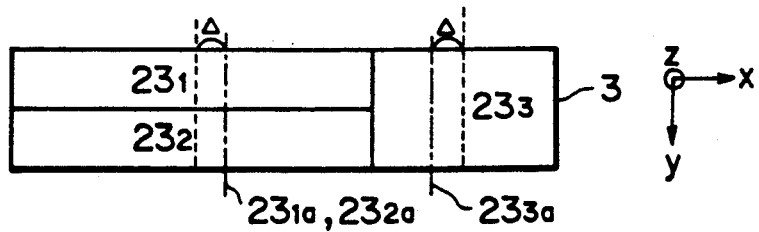

For example, in regard to the division of the pattern area on the mask and the wafer, there are many possible variations, an example of which is illustrated in FIG. 11. In the FIG. 11 example, reference numerals $22_1$, $22_2$ and $22_3$ denote FZP pattern areas on a mask 2, while reference numerals $23_1$, $23_2$ and $23_3$ denote FZP pattern areas on a wafer. The portions $22_1$ and $23_1$ are used in a pair, the portions $22_2$ and $23_2$ are used in another pair, and the portions $22_3$ and $23_3$ are used in a further pair. The mask-to-wafer alignment can be detected on the basis of the spacing between a light spot formed by the combination $22_1$ and $23_1$ and a light spot formed by the combination $22_2$ and $23_2$, on the sensor surface. On the other hand, the surface spacing between the mask and the wafer can be detected on the basis of the spacing between a light spot formed by the combination $22_2$ and $23_2$ and a light spot formed by the combination $22_3$ and $23_3$, on the sensor surface. Those lines denoted at $22_{1a}$, $22_{2a}$, $22_{3a}$, $23_{1a}$, $23_{2a}$ and $23_{3a}$, parallel to the Y axis and containing the respective principal axes of respective FZP pattern areas, are in such positional relationship as illustrated.

Figure 12:
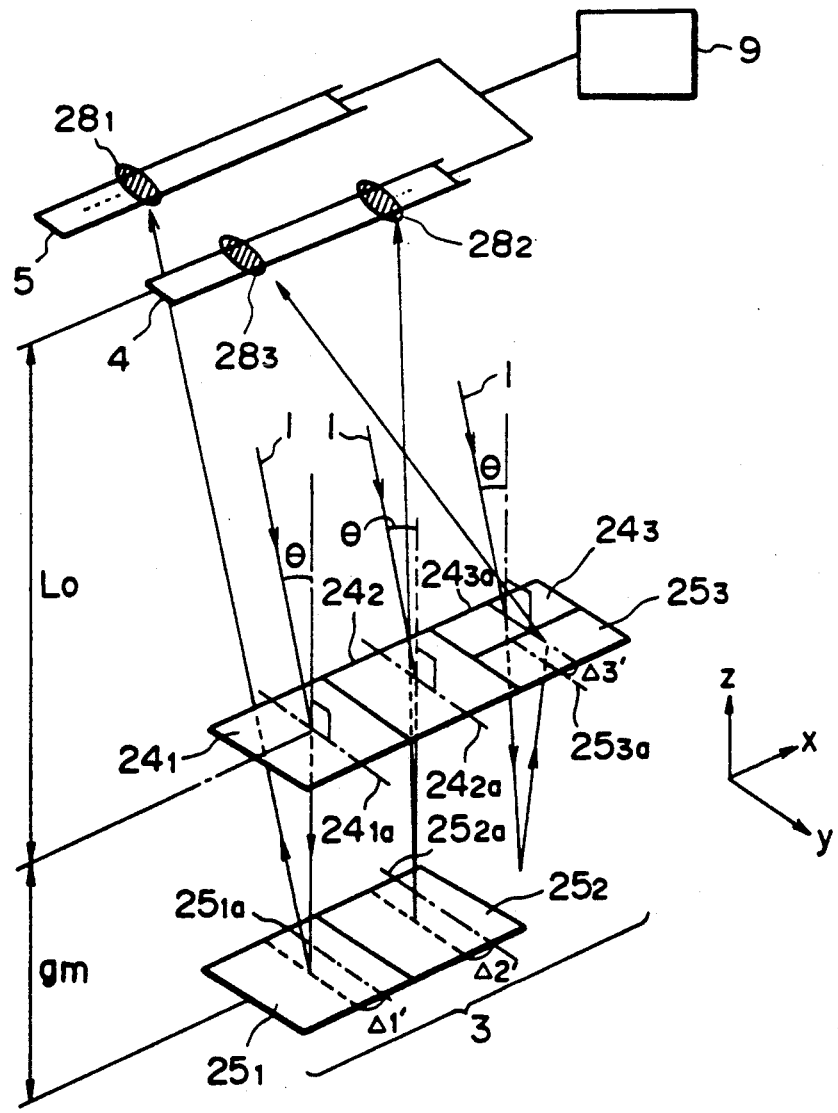
FIG. 12 is a perspective view of a major part of an apparatus according to a fourth embodiment of the present invention.

FIGS. 12, 13 and 14 show another embodiment, wherein FIG. 12 is a perspective view and FIG. 13 is a representation of the device as viewed in a direction (Y direction) perpendicular to the lengthwise direction of lines of sensors 4 and 5, the reflectively diffracted light from a wafer being illustrated as an equivalent, transmissibly diffracted light. FIG. 14 shows the relationship of FZP pattern areas on a mask and a wafer, with the optical axes of the zone plates. In FIG. 12, numerals $24_1$, $24_2$, $24_3$ and $25_3$ denote Fresnel zone plates provided on the mask, and numerals $25_1$ and $25_2$ denote Fresnel zone plates provided on the wafer. Numerals $24_{1a}$, $24_{2a}$, $24_{3a}$, $25_{1a}$, $25_{2a}$ and $25_{3a}$ denote those lines parallel to the Y-axis and containing the optical axis of these zone plates, respectively. Any alignment error between the mask and the wafer can be detected by detecting the spacing between a light spot $28_1$, formed by a combination of the patterns $24_1$ and $25_1$, and a light spot $28_2$ formed by a combination of Fresnel zone plates $24_2$ and $25_2$, as illustrated in FIG. 13. The surface spacing between the mask and the wafer can be detected by detecting the relationship between a light spot $28_2$, formed by a combination of the Fresnel zone plates $24_2$ and $25_2$, and a light spot $28_3$ formed by a combination of the Fresnel zone plates $24_3$ and $25_3$ (each being provided on the mask). An important feature of the embodiment shown in FIGS. 12 and 13 resides in that, in part (C) of FIG. 13, the pattern on the wafer may be omitted. Namely, the light from the FZP $24_3$ is simply regularly reflected by the wafer 3 surface and, by means of the FZP patterns $24_3$ and $25_3$ provided on the mask, the light spot $28_3$ to be used for detection of the mask-and-wafer surface spacing is produced.

In FIG. 13, the patterns $25_1$ and $25_2$ on the wafer have their optical axes shifted by $\Delta_1'$ and $\Delta_2'$ from the axes of the patterns on the mask, in the directions as illustrated. Also, the axes of the patterns $24_3$ and $25_3$ on the mask are mutually deviated by $\Delta_3'$, while retaining the parallel relationship. Where the light spots $28_1$, $28_2$ and $28_3$ formed on the sensors 5 and 4 are at distances $g_1'$, $g_2'$ and $g_3'$ from the axes of the patterns $24_1$, $24_2$ and $24_3$ on the mask (in the directions as illustrated in FIG. 13), the following relations are provided:

$$g_1' = \frac{L_0 + 2g_m - f_{M1}'}{f_{M1}' - g_m} \cdot \Delta_1' \quad (10)$$

$$g_2' = \frac{L_0 + 2g_m + f_M}{f_{M2}' + g_m} \cdot \Delta_2' \quad (11)$$

$$g_3' = \frac{L_0 + f_{M3}' + 2g_m}{f_{M3}' + 2g_m} \cdot \Delta_3' \quad (12)$$

As determined by equations (10), (11) and (12) and for the reason the same as that having been described with reference to the embodiment shown in FIG. 4, with the device shown in FIGS. 12-14 it is possible to execute detection of lateral positional deviation and measurement of surface spacing, without being affected by any inclination of the wafer. As described with reference to the present embodiment, the measurement of the surface spacing between a mask and a wafer can be made without a pattern on the wafer, by using zero-th order reflection light from the wafer. However, it is a possible alternative that, as shown in FIG. 15, a straight grating $25_4$ is provided in an area on the wafer 3, having no pattern, so that only a reflecting action is applied by the wafer to the light having been diffracted by the pattern area $24_3$ of the mask, for enhancement of the efficiency of impingement of light to the area $25_3$ on the mask.

The foregoing description has been made to examples wherein a mask and a wafer are disposed close to each other. However, the invention is applicable also to steppers (step-and-repeat type exposure apparatuses) such as an optical stepper or an excimer laser stepper that uses an excimer laser. Examples will now be explained with reference to FIGS. 16 and 17.

Figure 16:
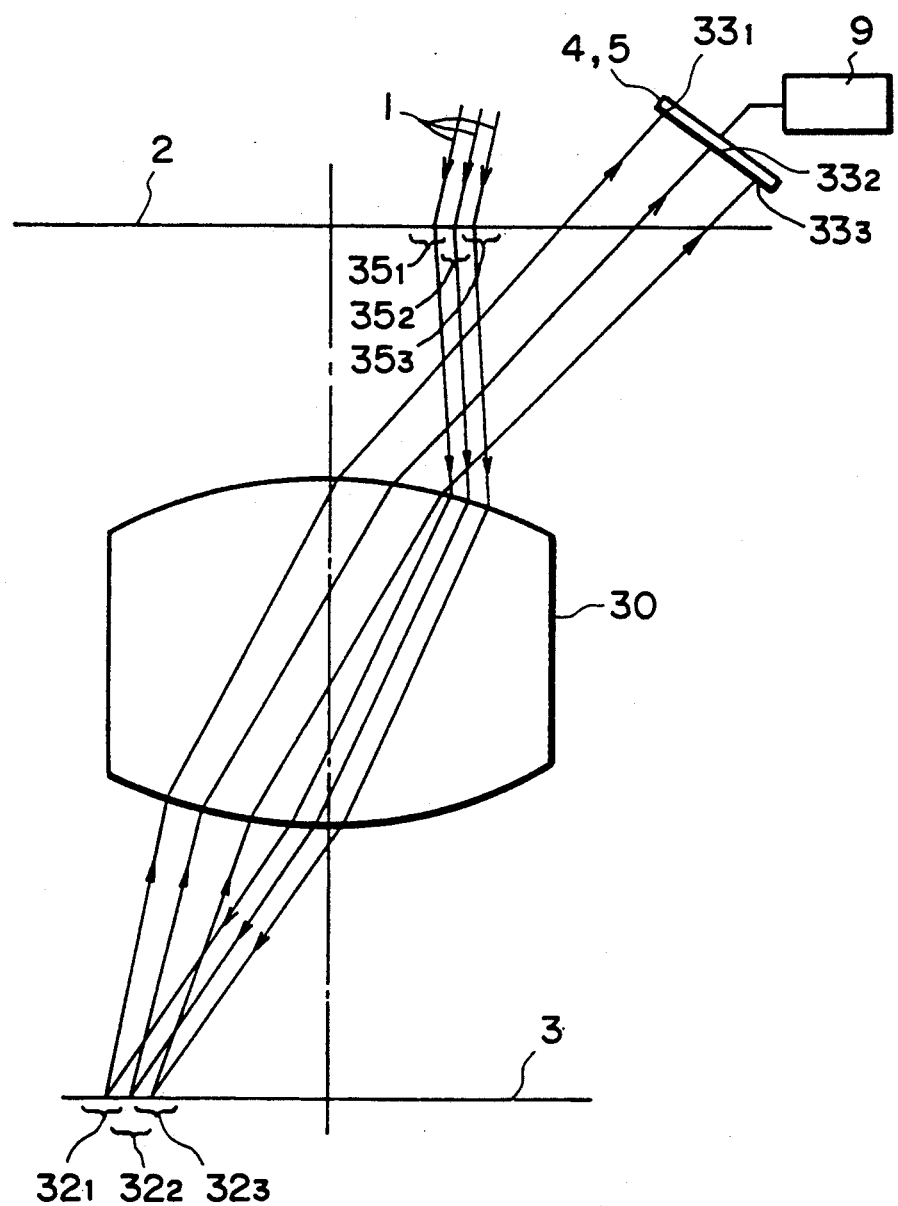
FIG. 16 is a schematic view of an apparatus according to a fifth embodiment of the present invention.

In FIG. 16, denoted at 1 is a light which illuminates FZP patterns $35_1$, $35_2$ and $35_3$ provided on a reticle 2, and denoted at $32_1$, $32_2$ and $32_3$ are FZP patterns provided on a wafer. Numeral 30 denotes an imaging lens.

The lights diffracted by the patterns (FZPs) $32_1$, $32_2$ and $32_2$ on the wafer are converged to form spots $33_1$, $33_2$ and $33_3$ on sensors 4 and 5, each comprising a CCD sensor, for example. Each of the patterns $35_1-35_3$ on the wafer and the patterns $32_1-32_3$ on the wafer is formed by a diffraction pattern, designed in accordance with the same concept as that of the FIG. 4 embodiment disclosed in this Specification. By measuring the spacings of the spots $33_1$, $33_2$ and $33_3$, like the foregoing embodiments, it is possible to detect the spacing between the reticle 29 and the wafer 31 and to measure any deviation along a plane (i.e. lateral positional deviation) therebetween. While in the FIG. 16 example the sensors 4 and 5 are disposed adjacent to the reticle 29, it is not always necessary that the reflective diffraction light from the wafer comes back to the reticle side. That is, a mirror or a half mirror may be disposed in the course of this light and, at a position between the wafer and the imaging lens 30, it is directed outwardly of the imaging optical system and then is received by the sensor.

Figure 17:
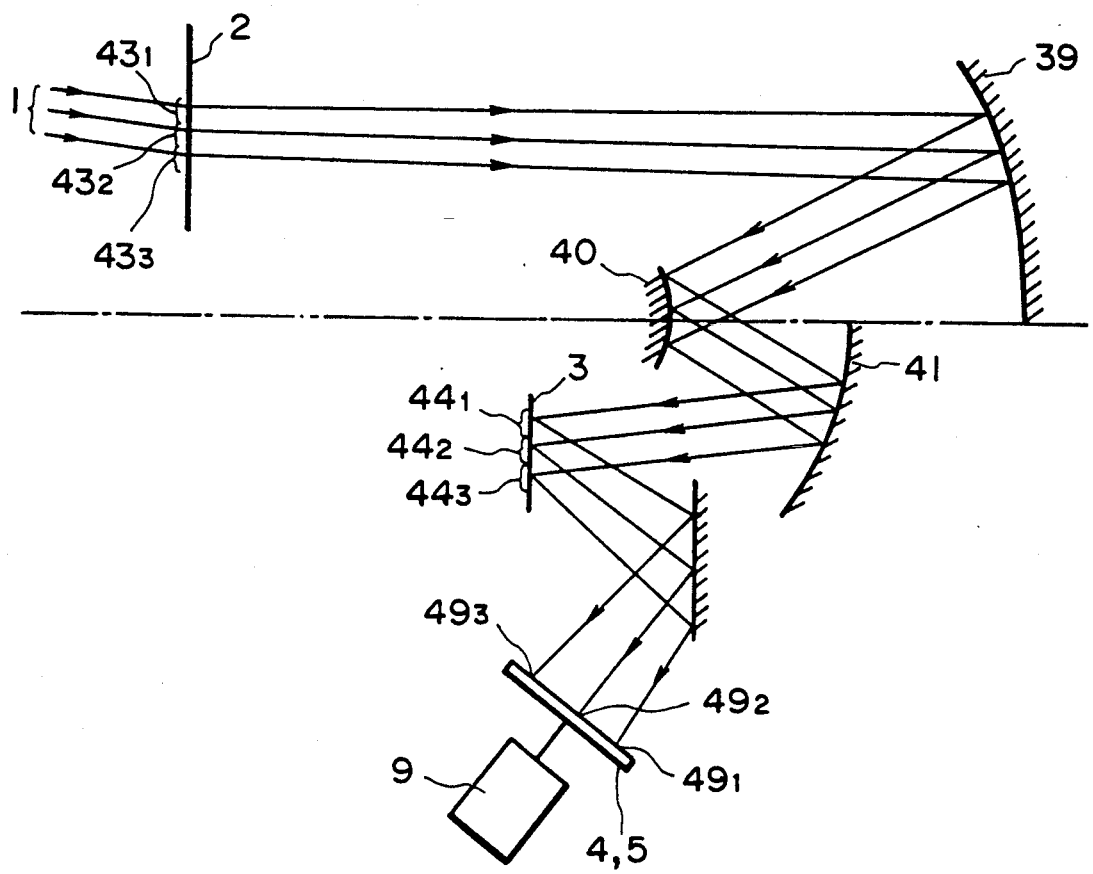
FIG. 17 is a schematic view of an apparatus according to a sixth embodiment of the present invention.

FIG. 17 shows an example wherein the invention is applied to a mirror projection type stepper. Reticle 2 and wafer 3 are disposed in an optically conjugate (imaging) relationship, with respect to three groups of mirrors 39, 40 and 41.

Numerals $43_1$, $43_2$ and $43_3$ denote FZP patterns provided on the reticle 2, and numerals $44_1$, $44_2$ and $44_3$ denote FZP patterns provided on the wafer 42. These patterns are structured in accordance with the same principle as of the FIG. 4 embodiment. By measuring the spacings of spots $49_1$, $49_2$ and $49_3$ formed on a sensor 9, it is possible to detect any deviation in the X-Y plane of the mask and the wafer (i.e. lateral positional deviation) and to detect the surface spacing between them. The principle of detection is the same as of the foregoing embodiment.

FIG. 18 illustrates a modified form of the FIG. 4 embodiment. In this example, the combination of patterns $6_1$ and $7_1$; and $6_2$ and $7_2$, illustrated at parts (A) and (B) of FIG. 4 is used as it is and the alignment error is detected in the same principle as that of the FIG. 4 embodiment. As contrasted, with regard to the spacing between the mask and the wafer, in this example, it is detected on the basis of the position of a spot $8_2$ on the sensor 4 surface. This will be explained in more detail.

First, as a mask is initially set in the apparatus, a reference position of the spot $8_2$ (i.e., the position as assumed when the mask and the wafer have no relative positional deviation and also they are set at a correct spacing) is determined. This can be done on the basis of trial printing, for example. Since values $L_0$, $f_{M2}$ and $\Delta$ can be predetermined from design values, the position of the optical axis of the FZP $6_2$, on the surface of the sensor 4, can be determined in accordance with equation (2'). In the actual spacing measuring operation, first the alignment error is detected in accordance with the principle described hereinbefore and, subsequently, the detected alignment error is corrected to reduce the same to zero. Then, any deviation of the spot $8_2$ at that time from the optical axis position is measured by using the sensor 4 to obtain $g_2$ and, thereafter, from equation (2') a current spacing gm is detected.

FIG. 19 illustrates another modified form of the FIG. 4 embodiment. In this example, the combination of patterns $6_2$ and $7_2$, $6_3$ and $7_3$, illustrated at parts (B) and (C) of FIG. 4, is used as it is, and the spacing between a mask and a wafer is detected in the same principle as of the FIG. 4 embodiment. As contrasted, with regard to the detection of any alignment error between the mask and the wafer, it is made on the basis of the position of a spot $8_2$ on the sensor 4 surface. This will be explained in greater detail.

As a mask is initially set in the apparatus, like the FIG. 18 embodiment, the reference position as well as the correct spacing gm are detected. Then, in the actual position detecting operation, a current spacing is measured in accordance with the principle described hereinbefore, and subsequently, any error is corrected to establish the correct spacing. Any deviation of the spot $8_2$ at that time from its reference position is measured to obtain $\Delta g_2$ and, from equation (2'') the alignment error $\delta$ is detected.

Figure 20:
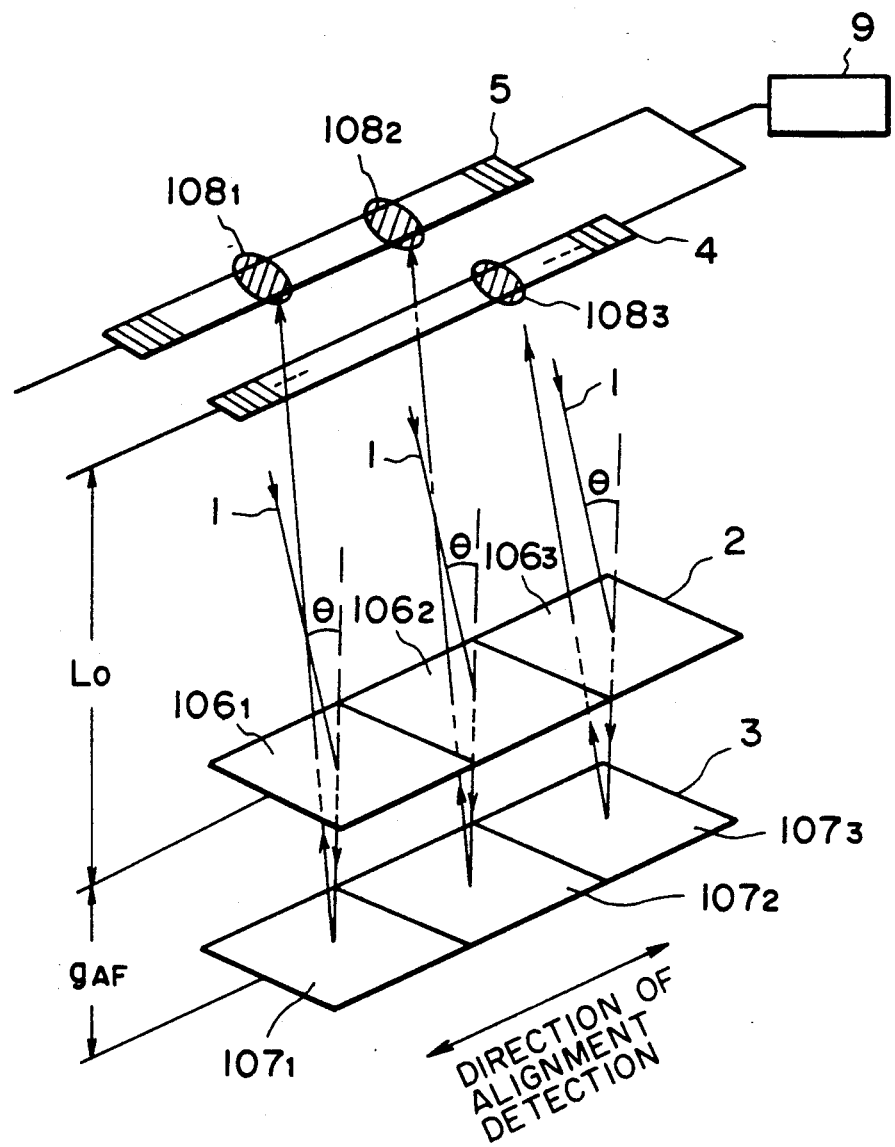
FIG. 20 is a perspective view of a major part of an apparatus according to a ninth embodiment of the present invention.
Figure 21A:
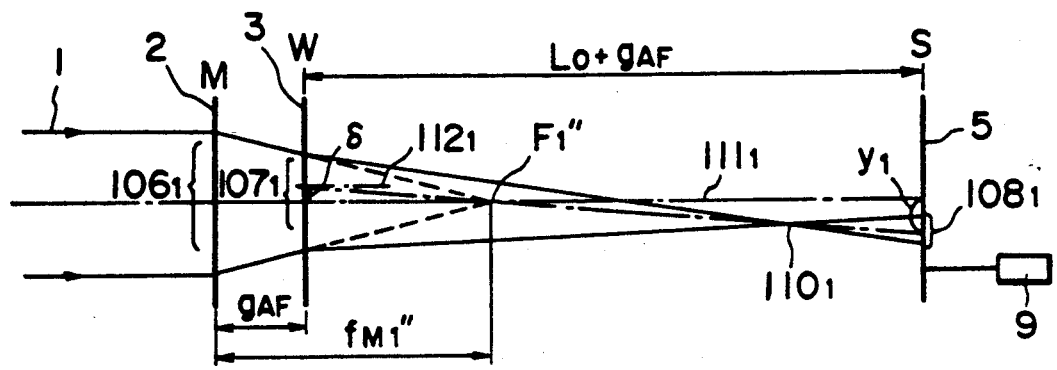
FIGS. 21A-21C and 22A-22C are schematic representations, respectively, illustrating the principle of the apparatus of the FIG. 20 embodiment, wherein the optical paths are shown in unfolded views, respectively.
Figure 21B:
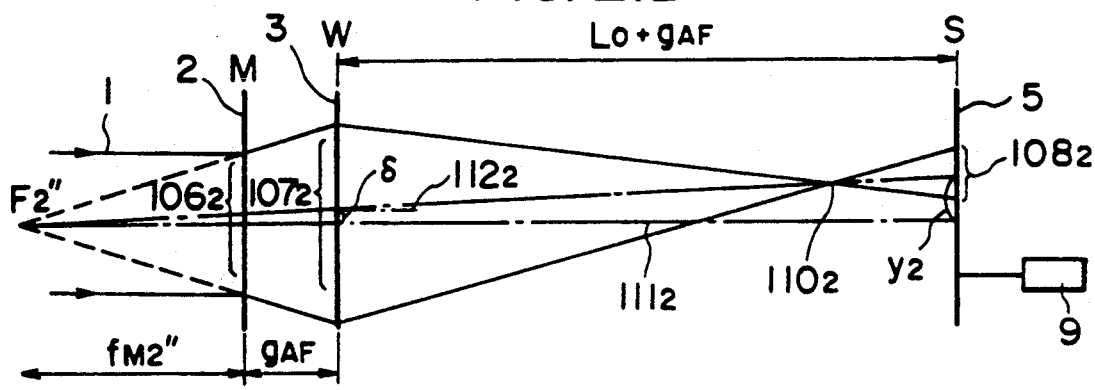
Figure 21C:
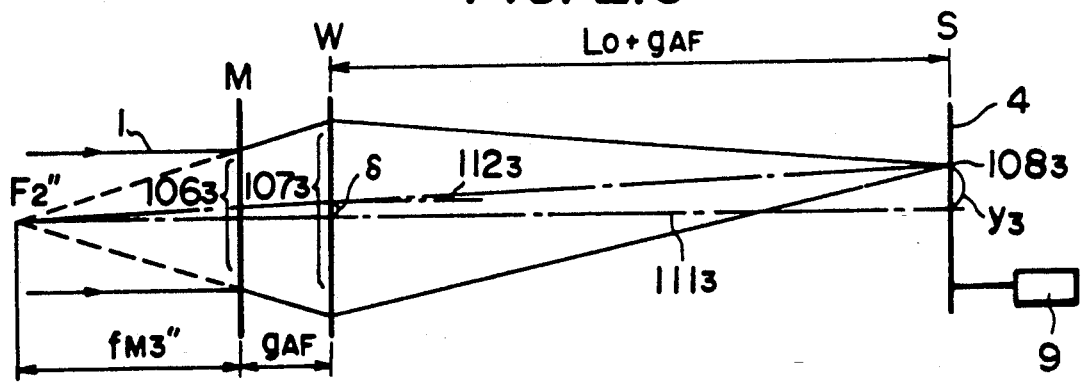
Figure 22A:
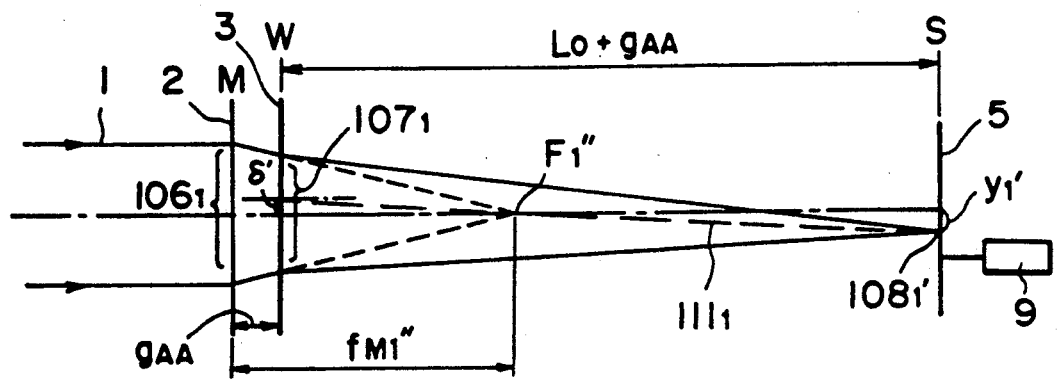
Figure 22B:
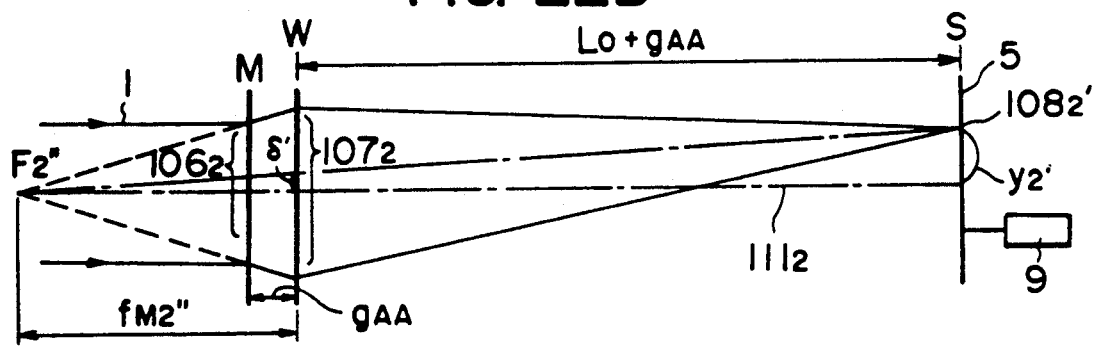
Figure 22C:
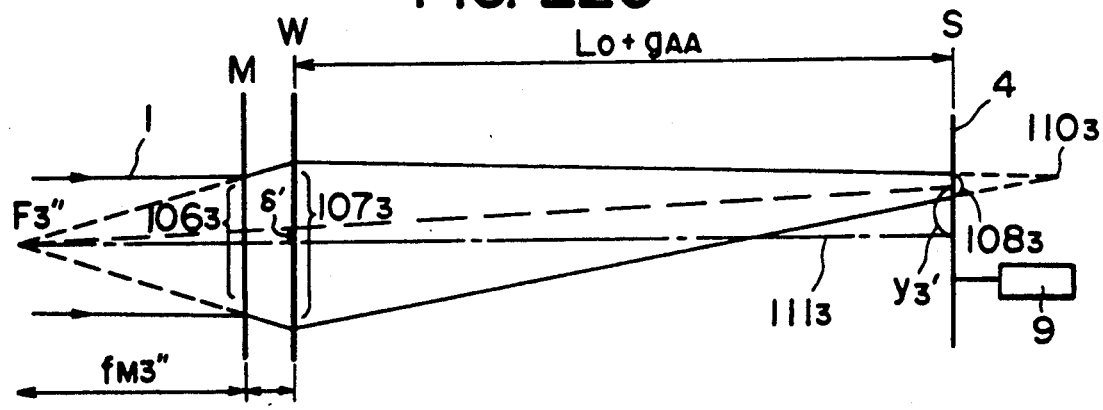

FIG. 20 is a perspective view of a major part of a ninth embodiment of the present invention. FIGS. 21 and 22 are schematic representations of the major part of the device, as viewed in a direction which is perpendicular to the alignment detecting direction and which is parallel to first and second objects, the optical paths being illustrated in an unfolded state. FIGS. 21 and 22 are different, in respect to the spacing between the first and second objects.

In FIG. 20, denoted at 1 is a light supplied from a light source such as, for example, an He-Ne laser or a semiconductor laser. Denoted at 2 is a first object which is a mask, for example, and denoted at 3 is a second object which is a wafer, for example. The mask 2 and the wafer 3 are disposed opposed to each other with a spacing $g_{AF}$ (FIGS. 20 and 21) or a spacing $g_{AA}$ (FIG. 22) maintained therebetween. Numerals $106_1$, $106_2$ and $106_3$ denote first, second and third physical optic elements each being provided in a portion of a mask 2. Numerals $107_1$, $107_2$ and $107_3$ denote first, second and third physical optic elements each being provided in a portion of the wafer. Each of these physical optic elements $106_1-106_3$ and $107_1-$ is formed, for example, by a diffraction grating or a Fresnel zone plate (which hereinafter will also be referred to simply as "FZP").

Figure 23A:
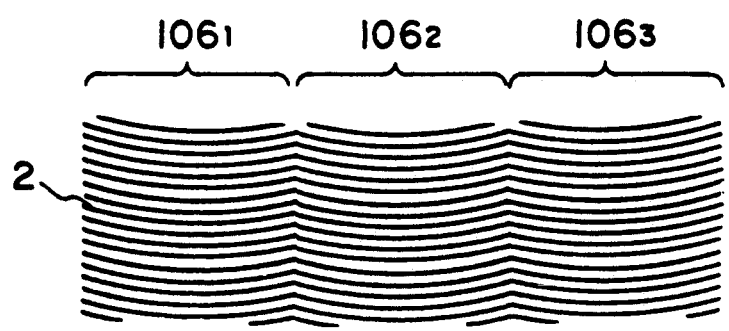
FIGS. 23A and 23B illustrate example of patterns to be provided on a mask and a wafer, in the FIG. 20 embodiment.
Figure 23B:
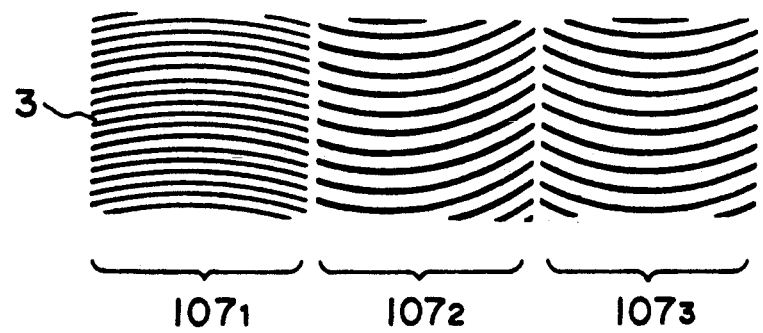

FIG. 23 shows examples of patterns for the physical optic elements $106_1-106_3$ and $107_1-107_3$ to be provided on the mask 2 and the wafer 3.

Denoted at 4 and 5 are first and second light receiving means (sensors) each comprising a line sensor or a position sensing diode (PSD), for example, and each being adapted to detect, for example, the position of the center of gravity of each inputted light $108_1$, $108_2$ or $108_3$. Signal processing circuit 9 is adapted to process the signals from the light receiving means 4 and 5 to detect, for example, the position of the center of gravity of each light $108_1$, $108_2$ or $108_3$ incident on the light receiving means 4 or 5. Also, the signal processing circuit is adapted to determine, by calculation, any positional error $\delta$ and the spacing $d_0$, between the mask 2 and the wafer 3.

In this embodiment, light 1 (whose wavelength $\lambda = 830$ nm, for example) from a semiconductor laser LD is incident on the first, second and third Fresnel zone plates $106_1$, $106_2$ and $106_3$ on the mask 2, at an angle $\theta$. Diffraction lights of a predetermined order or orders, diffracted perpendicularly from the mask 2, are reflectively diffracted by the FZP patterns $107_1$, $107_2$ and $107_3$ on the wafer 3 surface. Those of the diffraction lights of a predetermined order or orders, reflectively diffracted by the FZP patterns $107_1-107_3$ on the wafer 3, which pass the mask 2 without being affected thereby (i.e. in the form of zero-th order transmission light), are received by the light receiving means 4 and 5. Here, the positions of the gravity center of the inputted lights $108_1$, $108_2$ and $108_3$, incident on the surfaces of the light receiving means 4 and 5, are detected by these light receiving means 4 and 5. By using output signals from the light receiving means 4 and 5, the signal processing circuit 9 calculates the amount of positional error between the mask 2 and the wafer 3 as well as the surface spacing between them.

The present embodiment uses three detection systems, i.e., a detection system A comprising first physical optic elements $106_1$ and $107_1$; a detection system B comprising second physical optic elements $106_2$ and $107_2$; and a detection system C comprising the third physical optic elements $106_3$ and $107_3$, provided on the mask 2 and the wafer 3. Of these detection systems, the detection system A and the detection system B cooperate to provide a positional deviation detecting system. The detection system B is used in common, and the detection systems B and C cooperate to provide a surface spacing detecting system.

In regard to the light converging or diverging effect of the Fresnel zone plates shown in FIGS. 21 and 22, each of the FZP patterns $106_1$, $107_2$ and $107_3$ has a converging, positive power, while each of the FZP patterns $106_2$, $106_3$ and $107_1$ has a diverging, negative power. The Fresnel zone plate is not limited to one having a refracting or diverging function only in respect to the alignment direction. Namely, in this embodiment, such a Fresnel zone plate as having a two-dimensional refracting or diverging function is usable.

In the FIG. 22 example, the mask 2 and the wafer 3 are disposed close to each other (the surface spacing is 5-100 microns, for example), so that the arrangement is suitably incorporated into what can be called an "X-ray stepper" wherein the exposure is made by using X-rays.

Usually, in an X-ray stepper, an exposure area per one exposure using X-rays is of a size 10 to several tens of millimeters square, and while intermittently shifting the wafer 3 position, exposures of twenty (20) to several tens of shots are made.

For this reason, in many cases, the spacing between a mask and a wafer at the time of relative movement of them, for each shot, differs from the spacing between the mask and the wafer as measured just before the initiation of the exposure operation through a positional deviation detecting system (auto alignment system).

The surface spacing illustrated in FIG. 22 is one as assumed at the time of autoalignment, and it is of on an order of 5-100 microns as described hereinbefore. As compared therewith, the surface spacing illustrated in FIG. 21 is one as assumed at the time of wafer movement, and it is large, of a value of 50-200 microns.

As described, the surface spacing at the time of wafer movement is set to be large. This is made so as to prevent contact of the wafer with the mask surface during movement of the former along the X-Y plane, due to any surface height irregularity or tilt (inclination) of the wafer.

The spacing $g_{AF}$ in FIG. 21 is one for which the mask and the wafer are set for execution of the wafer movement (shot area movement) and, in this state, the actual spacing between the mask and the wafer is detected. This is called "autofocusing". The spacing $g_{AA}$ shown in FIG. 22 is one for which the mask and the wafer are set for execution of detection of any positional deviation therebetween (autoalignment), the mask and the wafer being set to this spacing on the basis of the measurement of the surface spacing as the mask and the wafer are placed at the spacing $g_{AF}$ in FIG. 21.

Next, description will be made of the position of incidence and the spot diameter of each inputted light $108_1$, $108_2$ or $108_3$ on the light receiving means 4 or 5.

It is now assumed for convenience that in FIG. 21 the mask 2 and the wafer 3 have relative positional deviation of an amount $\delta$ in respect to a vertical direction as viewed in the sheet of the drawing. Also, it is assumed that the light spots $108_1$, $108_2$ and $108_3$ formed on the sensors 4 and 5 are at the positions of distances $y_1$, $y_2$ and $y_3$, respectively, from the optical axes (pattern axes) $111_1$, $111_2$ and $111_3$ of the FZP patterns $106_1$, $106_2$ and $106_3$ on the mask 2, respectively. Numerals $112_1$, $112_2$ and $112_3$ denote the axes of the FZP patterns $107_1$, $107_2$ and $107_3$, respectively, on the wafer. In respect to the X-coordinate, the optical axes $111_1$–$111_3$ are aligned with the optical axes $112_1$–$112_3$, respectively, when $\delta = 0$.

The powers of the Fresnel zone plates $106_1$, $107_1$, $106_2$ and $107_2$ of the mask and the wafer are so set that, when the mask and the wafer is at the spacing $g_{AA}$, spots $108_1$ and $108_2$ of smallest diameter are formed on the sensor 5. Also, the arrangement is such that, when the mask and the wafer are at the spacing $g_{AF}$, a spot $108_3$ of smallest diameter is formed on the sensor 104. Accordingly, when the deviation between pattern optical axes of the mask and the wafer is equal to a distance $\delta'$ and the spacing between the mask and the wafer is equal to the spacing $g_{AA}$, a diffraction spot $108_1'$ provided by a detection system A, comprising the combination of the FZP patterns $106_1$ and $107_1$, has a smallest diameter; a diffraction spot $108_2'$ provided by a detection system B, comprising the combination of the FZP patterns $106_2$ and $107_2$, has a smallest diameter; and a diffraction spot $108_3'$ provided by a detection system C, comprising the combination of the FZP patterns $106_3$ and $107_3$, is expanded and has a large diameter, focusing at a point farther than the sensor 4.

In FIG. 21, where $f_{M1}''$, $f_{M2}''$ and $f_{M3}''$ denote the focal lengths of the Fresnel zone plates $106_1$, $106_2$ and $106_3$, respectively, in regard to first order diffraction light, and $L_0$ denotes the surface spacing between the mask 2 and the line sensors 4 and 5, the distances $y_1$, $y_2$ and $y_3$ in FIG. 21 can be written as follows:

$$y_1 = (L_0 + 2g_{AF} - f_{M1}'')/(f_{M1}'' - g_{AF}) \cdot \delta \qquad (1''')$$

$$y_2 = (L_0 + 2g_{AF} + f_{M2}'')/(f_{M2}'' + g_{AF}) \cdot \delta \qquad (2''')$$

$$y_3 = (L_0 + 2g_{AF} + f_{M3}'')/(f_{M3}'' + g_{AF}) \cdot \delta \qquad (3''')$$

Also, in FIG. 22, if the mask 2 and the wafer 3 have relative positional deviation of an amount $\delta'$, the distances $y_1'$, $y_2'$ and $y_3'$ of the positions of the gravity centers of the light spots $108_1'$, $108_2'$ and $108_3'$, respectively, can be written as follows:

$$y_1' = (L_0 + 2g_{AA} - f_{M1}'')/(f_{M1}'' - g_{AA}) \cdot \delta' \qquad (4''')$$

$$y_2' = (L_0 + 2g_{AA} + f_{M2}'')/(f_{M2}'' + g_{AA}) \cdot \delta' \qquad (5''')$$

$$y_3' = (L_0 + 2g_{AA} + f_{M3}'')/(f_{M3}'' + g_{AA}) \cdot \delta' \qquad (6''')$$

Figure 24:
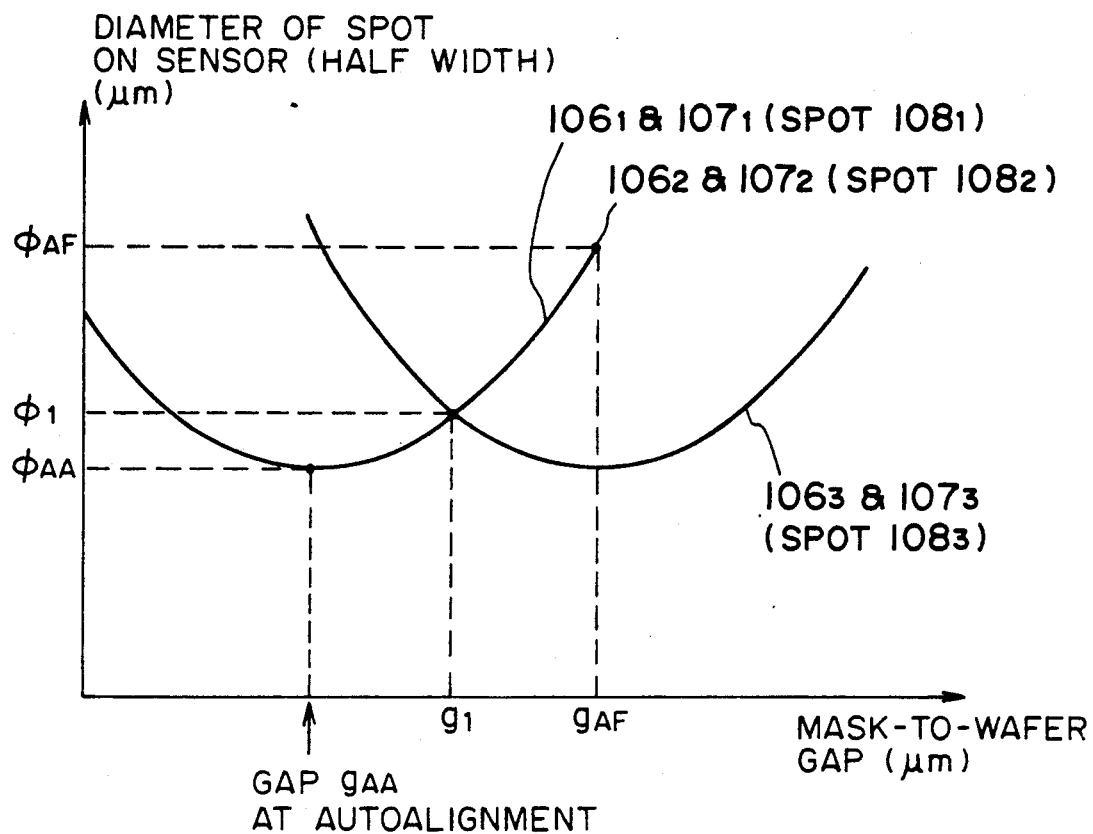
FIGS. 24 and 25 illustrate the relationship between, the mask-to-wafer interval and the spot diameter, in the FIG. 20 embodiment.
Figure 25:
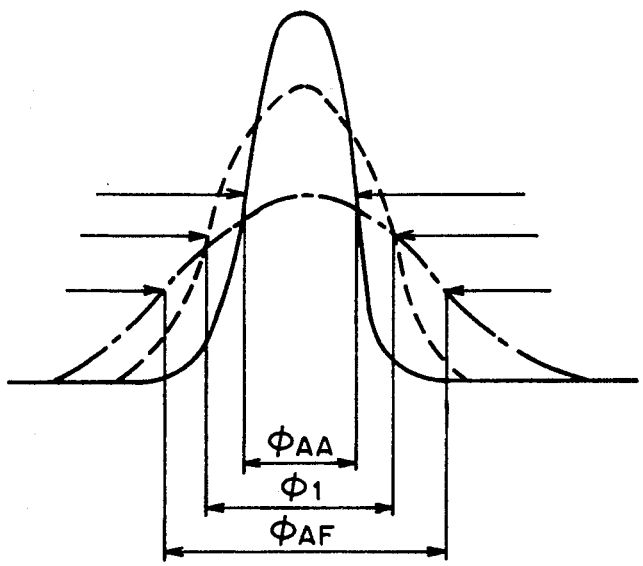

Here, each FZP on the mask or wafer has a pattern such as shown in FIG. 23, for example, and each pattern on the wafer is provided in a scribe line. Due to the diffraction effect of each of the Fresnel zone plates $106_1$ and $107_1$; $106_2$ and $107_2$; and $106_3$ and $107_3$, a change in the gap between the mask 102 and the wafer 103 causes a change in the diameter of each spot on the sensor 4 or 5 surface, since the imaging relationship is determined by the focal lengths of the Fresnel zone plates on the mask and the wafer. The manner of such change is illustrated in FIG. 24, by way of example. FIG. 24 shows this change, in terms of a half width of each light spot on the sensor 4 or 5. FIG. 25 illustrates the relationship between a half width $\phi_{AA}$ and a change in the diameter of a diffraction spot provided by the detection system A, for example, comprising the combination of the FZP patterns $106_1$ and $107_1$. Setting is made so that, when the spacing becomes equal to that for the autoalignment (see FIG. 22, part (A)), the spot diameter becomes smallest. For a larger spacing $g_b$ or larger spacing $g_{AF}$, the half width $\phi_1$ or $\phi_{AF}$ becomes gradually larger. The half width on the sensor 5 of a spot of light diffracted by the detection system B, comprising a combination of the FZP patterns $106_2$ and $107_2$, as well as the half width on the sensor 4 of a spot of light diffracted by the detection system C, comprising a combination of the FZP patterns $106_3$ and $107_3$, are set such as shown in FIG. 24.

Figure 26A:
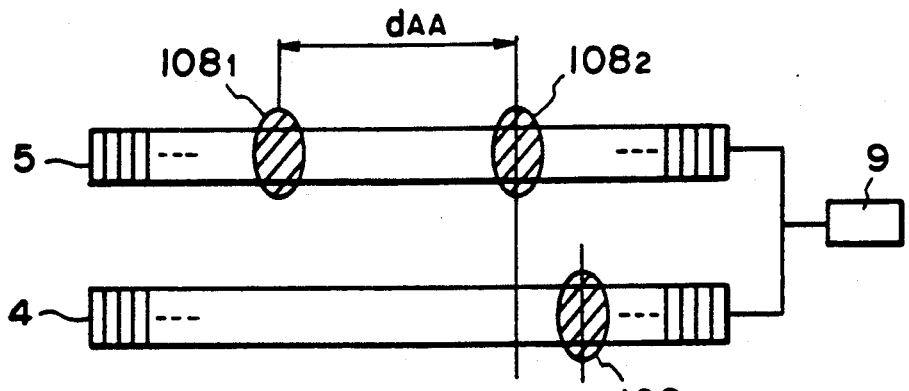

Here, the state of spots on the sensors 5 and 4 when the mask and the wafer are at the spacing $g_{AF}$, as in FIG. 21, is illustrated in FIG. 26A. Of the formed spots $108_1$, $108_2$ and $108_3$, the spacing between the spots $108_1$ and $108_2$ in the alignment detecting direction (e.g. the distance between the positions of gravity centers) provides the information related to a deviation between the mask and the wafer in a plane (alignment error), as in the FIG. 4 embodiment, while the size of each of the spots $108_2$ and $108_3$ (e.g., a width that corresponds to a half of a peak value) provides the information related to the surface spacing between the mask and the wafer. A particular numerical example of this embodiment will be explained below.

It is now assumed that $L_0 = 18345.94$ microns; $g_{AF} = 71.5$ microns; $g_{AA} = 30$ microns; the diffraction by the combination of FZP patterns $106_1$ and $107_1$ is effective to form a smallest spot on the sensor when the spacing is equal to $g_{AA}$; and the displacement $y_1'$ of a spot on the sensor surface is of an amount onehundred (100) times larger than the deviation $\delta'$ between the mask and the wafer.

The diffraction by the combination of FZP patterns $106_2$ and $107_2$ is set so that the spot on the sensor surface becomes smallest when the spacing is equal to $g_{AA}$. The displacement of the spot on the sensor is of an amount one-hundred (100) times larger than the positional deviation between the mask and the wafer.

The diffraction by the detecting system C, comprising the combination of FZP patterns $106_3$ and $107_3$, is set so that the spot on the sensor surface becomes smallest when the spacing is equal to $g_{AF}$. Here, $$y_1'/\delta' = (L_0 + 2g_{AA} - f_{M1}'')/(f_{M1}'' - g_{AA})$$
$$= (18345.94 + 60 - f_{M1}'')/(f_{M1}'' - 30)$$
$$= 100$$

It follows therefrom that:

$f_{M1}'' = 211.94$ microns.

Also, $$y_2'/\delta' = (L_0 + 2g_{AA} - f_{M2}'')/(f_{M2}'' - g_{AA})$$
$$= (18345.94 + 60 + f_{M2}'')/(f_{M2}'' + 30)$$
$$= 100$$

From this, it follows that:

$f_{MS}'' = 155.62$ microns.

Further, $$y_3'/\delta = (L_0 + 2g_{AA} + f_{M3}'')/(f_{M2}'' + g_{AA})$$
$$= (18345.94 + 143 + f_{M2}'')/(f_{M3}'' + 71.5)$$
$$= 100$$

From this, it follows that:

$f_{M3}'' = 114.53$ microns

If the deviation $\delta = \delta' = 2$ microns, the relationship between the spacing and the distances $y_1$, $y_2$, $y_3$, $y_1'$, $y_2'$ and $y_3'$, is such as follows:

| Gap | $y_1'$ | $y_2'$ | $y_3'$ |
|---|---|---|---|
| 30 microns | 200 | 200 | 256.29 |
| 71.5 microns | — | — | — |
| Gap | $y_1$ | $y_2$ | $y_3$ |
| 30 microns | — | — | — |
| 71.5 microns | 260.28 | 164.18 | 200 |

(unit: micron)

From the change in the spacing between the spots $108_1'$ and $108_2'$, the position deviation (alignment error) between the mask and the wafer is detectable. As set forth in the numerical example, a deviation between the mask and the wafer of an amount 2 microns causes a change in the spacing between the light spots $108_1'$ and $108_2'$ on the sensor surface by 400 microns. (Particular note should be paid to the values of the distances $y_1'$ and $y_2'$.) The spacing between the mask and the wafer is measured, not by measuring the spacing between the spots $108_2$ and $108_3$ on the sensor surface, but by measuring the size of each of the spots $108_2$ and $108_3$, in the manner described with reference to FIG. 24.

Actually, as illustrated in FIG. 26B, on the line sensors 4 and 5 there are obtained output signals of picture elements of each sensor in the units of a bit. Thus, when an output of the i-th bit is denoted by Ii and the bit size of the line sensor is denoted by 1, the position M of the center of gravity if it is used to represent the position of the spot, can be written as follows:

$$M = \left[\sum_{i_f}^{i_l} I_i \cdot i \cdot 1\right] / \left[\sum_{i_f}^{i_l} I_i\right] \tag{7'''}$$

wherein,
$i_f$: the number of a smallest address of the bits providing the spot distribution; and
$i_l$: the number of a largest address of the bits providing the spot distribution.

The positions of the gravity centers of the spots $108_1$, $108_2$ and $108_3$, determined in this manner are illustrated at $M_1$, $M_2$ and $M_3$ in FIG. 26B, by way of example.

Next, the calculation of the half width of the spot $108_2$ will be explained. Since usually a spot has an intensity distribution, like an Airy pattern so called in the field of lenses, in this example, it is considered that the spot has such as distribution of intensity like that. For example, if a functional form of a polynomial is applied to some bits, around the maximum output bit, of a line sensor, a maximum value in a spatially continuous output distribution on the sensor surface is obtainable from actually measured values of the output of these bits. When the maximum value is expressed by Imax, detection may be made to obtain a spatial value on the sensor that corresponds to "Imax/2", from interruptedly changing outputs. Also, in such a case, if the shape of the spot distribution is given by a functional approximation of a polynomial and calculations are made to detect the value on the sensor that corresponds to "Imax/2", the half width of the light spot $108_2$ can be determined with a precision of an order of 1/10-1/30 of the sensor bit size.

As an example, in this embodiment, if the size of each of the FZP patterns $106_1$-$106_3$ and $107_1$-$107_3$ is about 50 microns×90 microns, the spot diameter is about 200-800 microns. If the sensor bit size is about 500 microns×15 microns (pitch), the precision of detection of the half width of the spot can be 1 micron. Accordingly, by utilizing the characteristics that the spot half width changes such as shown in FIG. 24, it is possible to detect the spacing between the mask and the wafer on the basis of detection of the half width of the spot $108_2$ and the half width of the spot $108_3$. While the relationship between the mask-and-wafer spacing and these half widths can be predetermined in accordance with design values, such a relationship may be detected by experiments.

In the present embodiment, as described hereinbefore, the detection system B which comprises a combination of Fresnel zone plates $106_2$ and $107_2$, is used both for the autoalignment and for the autofocusing. This allows that, with a relatively small pattern area surface such as shown in FIG. 23, the two functions of autoalignment and autofocusing are provided. Further, in this embodiment, use is made of the fact that only the spacing between the spots $108_1'$ and $108_2'$ provides the information related to the positional deviation between the mask and the wafer, even if, as an example, the wafer is inclined or the relative positional relationship of the alignment detecting system (sensors 4 and 5 and detection processing portion 9 in FIG. 20) with the mask and the wafer changes slightly, the spots $108_1'$ and $108_2'$ on the sensor 5 changes by the same amount and the spacing itself between these spots is not affected by the wafer inclination or an error in the relative position of the detecting system with respect to the mask and the wafer. Therefore, stable detection is attained.

In the ninth embodiment shown in FIG. 20, it is not always necessary that the sensors 4 and 5 are directly disposed. In place thereof, the structure may be such that an aerial image of the light spot formed at the sensor 4 or 5 position is relayed by a lens system and the light therefrom may be projected to a line sensor or an area sensor.

In the ninth embodiment shown in FIG. 20, the alignment (autoalignment) of the mask and the wafer is executed by using those Fresnel zone plates on the mask and the wafer having lens functions like a convex-concave system and a concave-convex system, while the detection of the surface spacing between the mask and the wafer (autofocusing) is executed by using a concave-convex system and a concave-convex system. However, the power arrangement may be set as desired.

As an example, the autofocusing may be made by using a concave-convex system and a convex-concave system. Namely, in the present embodiment, any combination is usable provided that the focal lengths of the mask patterns and wafer patterns are adjusted and set so that the size of each of the spots, corresponding to the spots $108_2$ and $108_3$, changes with the spacing between the mask and the wafer.

In place of the line sensors, a two-dimensional area sensor may be used for the sensors 4 and 5 of the present embodiment. Further, the sensor arrangement may be made so that three light spots are projected to a single line sensor.

Figure 27A:
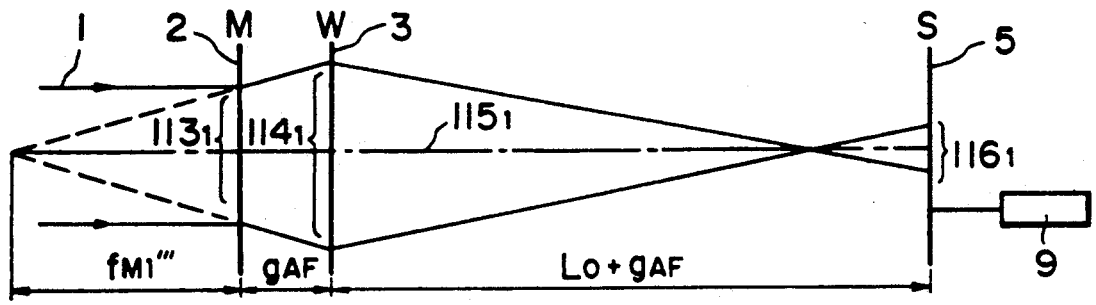
FIGS. 27A-27C and 28A-28C are schematic representations, respectively, illustrating the principle of an apparatus according to a tenth embodiment of the present invention, wherein the optical paths are shown in unfolded views.
Figure 27B:
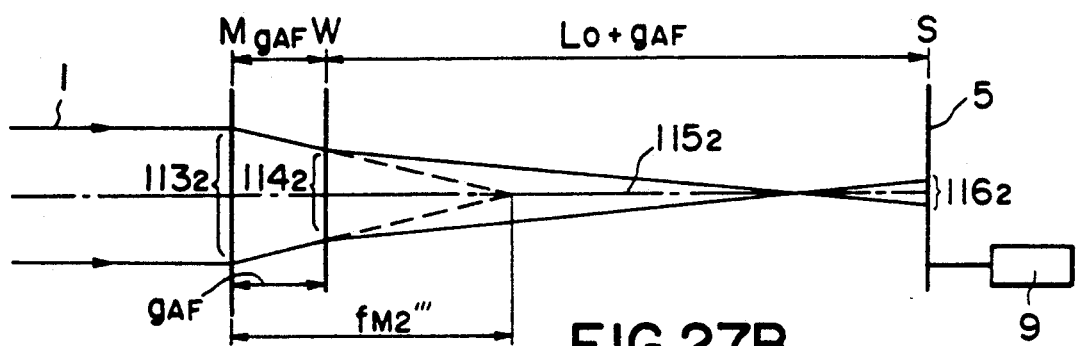
Figure 27C:
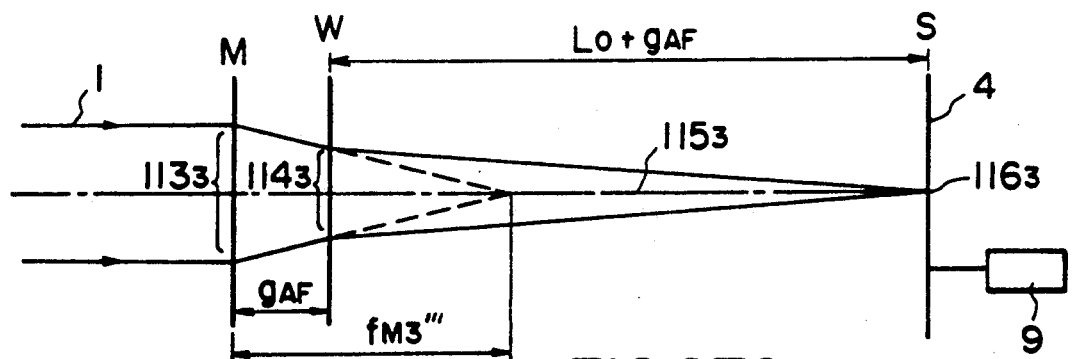
Figure 28A:
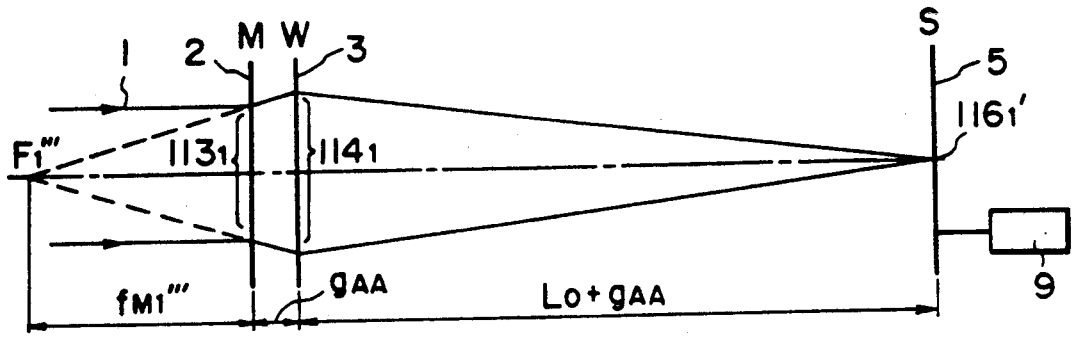
Figure 28B:
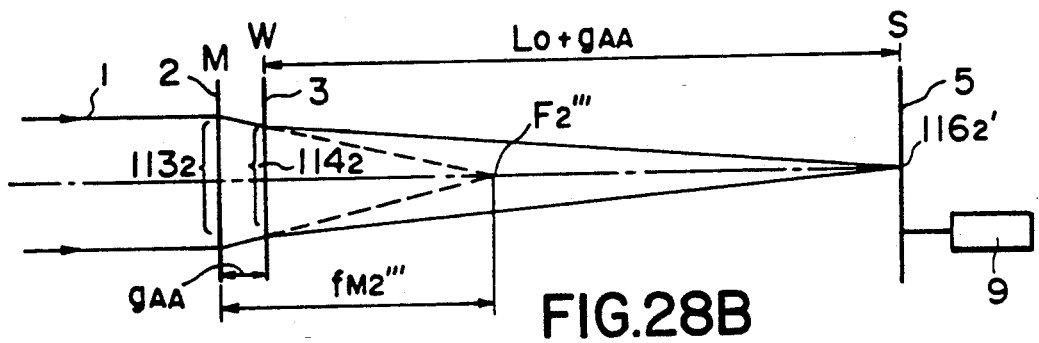
Figure 28C:
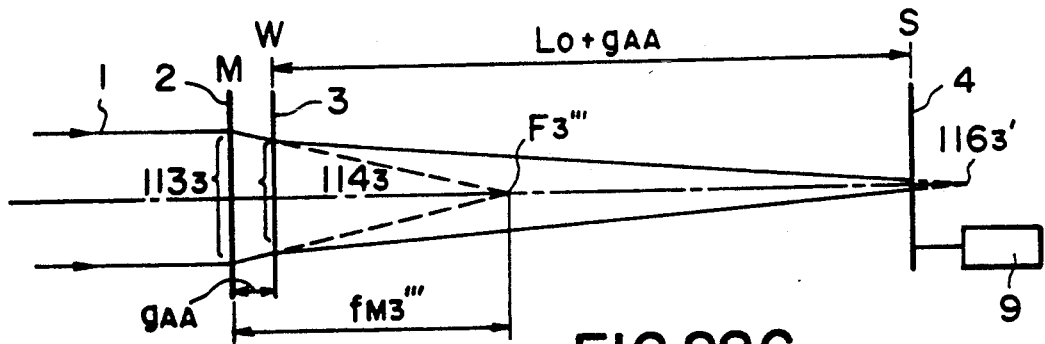

FIGS. 27 and 28 are schematic views, respectively, of a major part of a tenth embodiment of the present invention. Like FIGS. 21 and 22, FIGS. 27 and 28 show the optical paths, in an unfolded view, as the spacing between a first object (mask) 2 and a second object (wafer) 3 are changed, and these Figures show the device as viewed in a direction perpendicular to the alignment detecting direction.

In the states shown in FIGS. 27 and 28, respectively, the alignment of the mask 2 with the wafer 3 has been completed, such that no positional deviation is present therebetween.

In this embodiment, the autoalignment is executed by using a concave-convex system (detection system A) and a convex-concave system (detection system B), and is made by detecting the change in the spacing, on the sensor surface, between two spots obtained from these two detection systems. Also, the autofocusing is executed by using the convex-concave system (detection system B) and a convex-concave system (detection system C), and is made by detecting the size of each spot obtained from these two detection systems.

In FIGS. 27 and 28, for the autoalignment, measurement is made to the spacing between a spot $116_1'$ produced as a result of the diffraction at Fresnel zone plates $113_1$ and $114_2$ and a spot $116_2'$ produced as a result of the diffraction at Fresnel zone plates $113_2$ and $114_2$ and, subsequently, any positional deviation between the mask and the wafer in a plane is detected essentially in the same principle as having been described with reference to the first embodiment. Also, in regard to the spacing, it is detected in the same way as having been described with reference to the ninth embodiment, i.e. by measuring the size of a spot $116_2'$ produced as a result of the diffraction at Fresnel zone plates $113_2$ and $114_2$ and the size of a spot $116_3'$ produced as a result of the diffraction at Fresnel zone plates $113_3$ and $114_3$.

In regard to the ninth and tenth embodiments, description has been made to examples wherein only one-dimensional detection is made for an alignment error (positional deviation). However, for actual alignment of a mask and a wafer in a plane, it is necessary to detect three parameters in the X, Y and $\theta$ directions. If this is desired, as shown in FIG. 29, patterns used, in the foregoing embodiments (e.g. those shown in FIG. 23) may be provided outside a semiconductor circuit area 20 and at positions on a scribe line which is going to be used for the cutting, when it is on a wafer.

In FIG. 29, numerals $118_1$, $118_2$, $118_3$ and $118_4$ each denotes an FZP. The example shown in FIG. 29 is of a proximity type wherein a mask and a wafer are disposed close to each other. In this Figure, numerals $119_1$, $119_2$, $119_3$ and $119_4$ each denotes a detection system for executing the autoalignment or the autofocusing. Numerals $121_1$, $121_2$, $121_3$ and $121_4$ each denotes a light projected on a pattern. Also, numerals $122_1$, $122_2$, $122_3$ and $122_4$ each denotes a signal light which is obtainable as a result of diffraction by a combination of corresponding Fresnel zone plates of the mask and the wafer. The signal light comprises plural spots. The detection system $119_1$ has an ability of detecting one-dimensional lateral deviation in the X direction. Similarly, the detection system $119_2$, the detection system $119_3$ and the detection system $119_4$ have respective abilities for detecting positional deviations in the Y direction, X direction and Y direction, respectively.

When the detected values on the deviation as obtainable from these four detection systems are denoted by $\Delta x_1$, $\Delta y_1$, $\Delta x_2$ and $y_2$, it is sufficient for the detection of the positional deviation between the mask and the wafer to detect translational errors $\Delta X$ and $\Delta Y$ and a rotational error $\Delta\phi$. These errors can be easily determined from the four values ($\Delta x_1$, $\Delta x_2$, $\Delta y_1$ and $\Delta y_2$).

Also, the spacing between the mask and the wafer is detected at the four points near the Fresnel zone plates $118_1$, $118_2$, $118_3$ and $118_4$.

In accordance with the ninth and tenth embodiments as described hereinbefore, the detection of a three-dimensional positional error between a mask and a wafer as well as the positioning control for them based on the detection, can be done at high precision.

Figure 30:
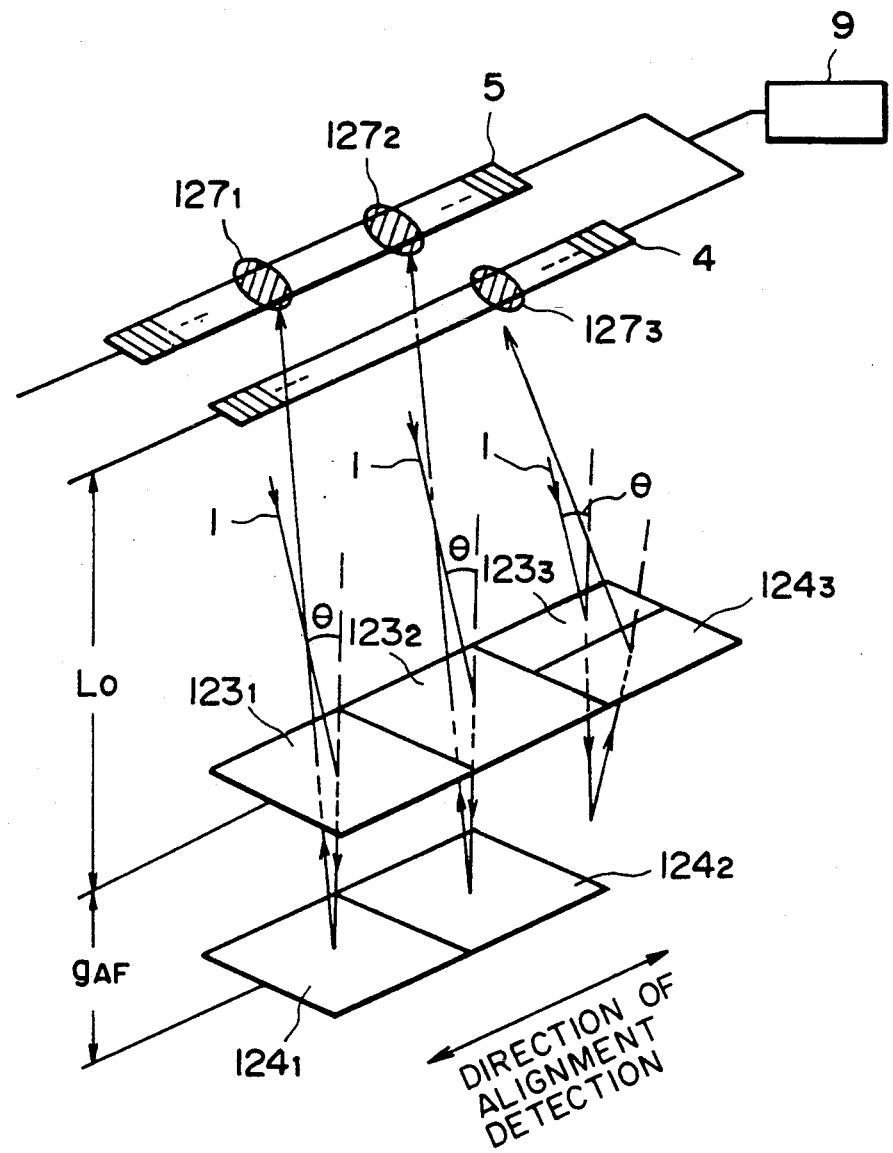
FIG. 30 is a perspective view of a major part of an apparatus according to an eleventh embodiment of the present invention.

FIG. 30 is a perspective view of a major part of an eleventh embodiment of the present invention. In this embodiment, one of a plurality of sets of diffraction patterns, from a mask and a wafer, each producing two spots for detection of the spacing between the mask and the wafer, uses zero-th order regular reflection by the wafer. That is, the present embodiment is an example wherein the wafer surface may have no pattern.

Figure 31A:
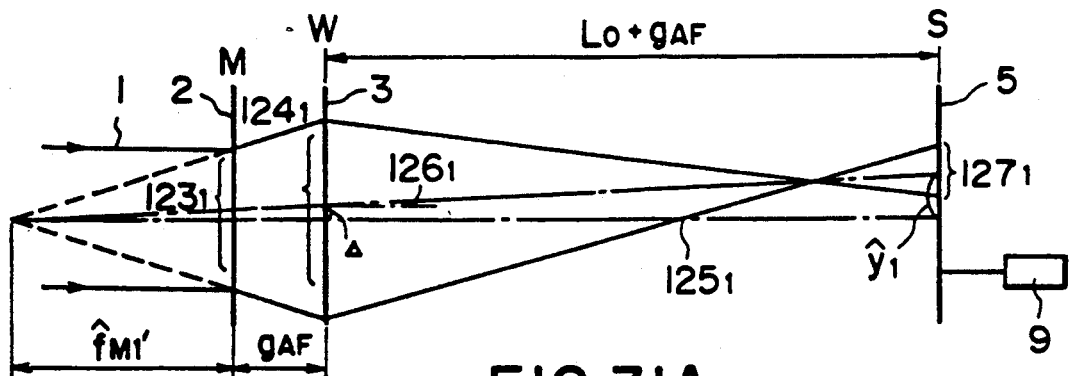
FIGS. 31A, 31B and 31C are schematic representations, illustrating the principle of the apparatus of the FIG. 30 embodiment, wherein the optical paths are shown in unfolded views.
Figure 31B:
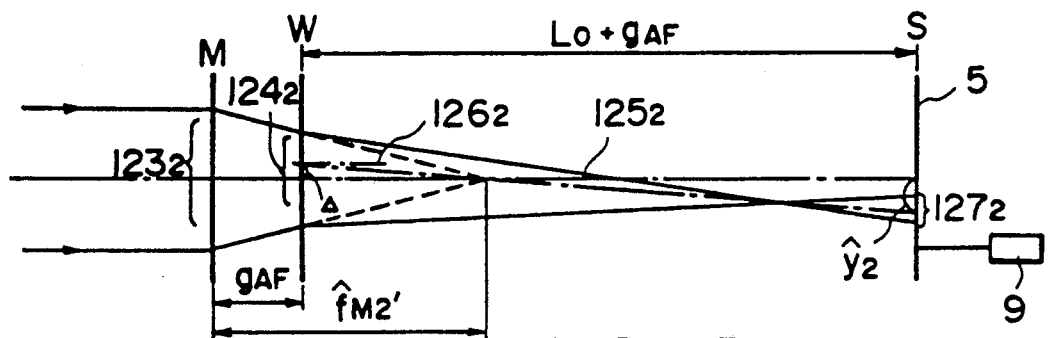
Figure 31C:
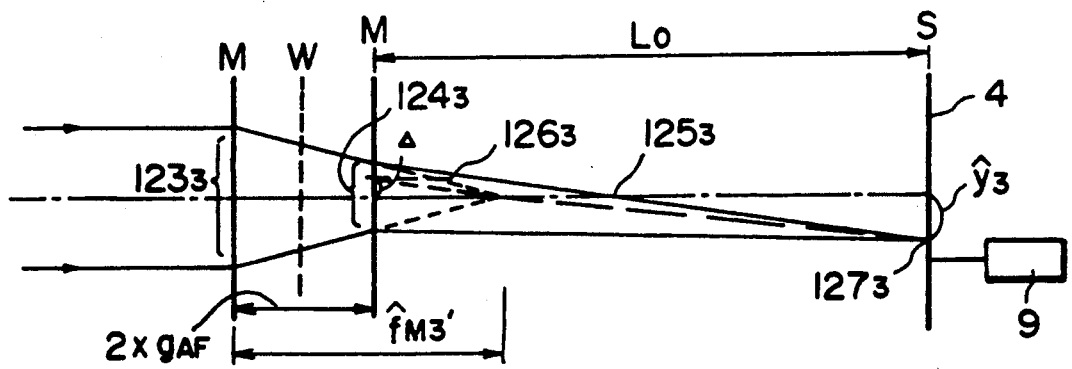

In FIG. 30, numerals $123_1$, $123_2$ and $123_3$ each denotes an FZP on the mask. FIG. 31 illustrates details of diffraction, as viewed in a direction perpendicular to the alignment detecting direction (FIG. 30) and parallel to the mask and the wafer, with the reflective diffraction by the wafer being illustrated as an equivalent, transmissive diffraction wave.

In this embodiment, a pattern of an FZP $124_3$ is provided on the mask, and by detecting the spacing between (i) a spot obtainable by diffraction at a detection system A, comprising a combination of FZP patterns $123_1$ and $124_1$, and (ii) a spot $127_2$ obtainable by diffraction at a detection system B, comprising a combination of FZP patterns $123_2$ and $124_2$, the mask-to-wafer deviation (alignment error) is detected. On the other hand, the surface spacing (gap) between the mask and the wafer is detected by detecting the size of a spot $127_2$, on a sensor 5 surface, obtainable by diffraction at the detection system B comprising the combination of FZP patterns $123_2$ and $124_2$, and the size of a spot $127_3$, on a sensor 4 surface, obtainable by diffraction at a detection system C, comprising a combination of FZP patterns $123_3$ and $124_3$.

The optical function of the remaining portion is the same as that of the ninth embodiment.

By using the Fresnel zone plates $123_3$ and $124_3$ provided on the mask, it is possible to reduce in size the pattern area on the wafer. This is a significant feature of the present embodiment.

As illustrated in part (c) of FIG. 31, the surface spacing between the Fresnel zone plates $123_3$ and $124_3$ is equal to $2 \times g_{AF}$, and the focal lengths and the imaging relationship of the patterns of these zone plates are set in consideration of it.

It is assumed in FIG. 31 that the mask and the wafer have relative positional deviation of an amount $\Delta$ and, on that occasion, the centers of light spots (more exactly, chief rays of them) are at the positions of distances $\hat{y}_1$, $\hat{y}_2$ and $\hat{y}_3$, respectively, from the optical axes of the FZP patterns $123_1$, $123_2$ and $123_3$, respectively, of the mask. Then, the following relations are satisfied:

$$\hat{y}_1 = [(L_0 + 2g_{AF} + \hat{f}_{M1})/(\hat{f}_{M1} + g_{AF})] \cdot \Delta \tag{8}$$

$$\hat{y}_2 = [(L_0 + 2g_{AF} - \hat{f}_{M2}')/(\hat{f}_{M2} - g_{AF})] \cdot \Delta \tag{9}$$

$$\hat{y}_3 = [(L_0 - 2g_{AF} + \hat{f}_{M3}')/(\hat{f}_{M3} - g_{AF})] \cdot \Delta \tag{10}$$

In accordance with the relations of equations (8), (9) and (10), the spacing between (i) a spot $127_1$ produced by the combination of FZP patterns $123_1$ and $124_1$ (combined power of a concave-convex system) and (ii) a spot $127_2$ produced by a combination of FZP patterns $123_2$ and $124_2$ (combined power of a convex-concave system) is calculated. Then, from the detected spacing, the positional deviation (alignment error) between the mask and the wafer is detected.

Each of the FZP patterns $123_1$–$123_3$ and $124_1$–$124_3$ has a lens function only in respect to the alignment detecting direction. However, it may have a lens function in respect to two-dimensional directions and, additionally, an area sensor may be used in place of the line sensors to detect the motion of each light spot. In regard to the change in the half width of each spot formed on a sensor surface by a combination of corresponding patterns, the setting is such that each of a spot produced by a combination of FZP patterns $123_1$ and $124_1$ and a spot produced by FZP patterns $123_2$ and $124_2$, all being used for the autoalignment, becomes smallest when the spacing $g_{AA}$ is established; while a spot produced by FZP patterns $123_3$ and $124_3$ becomes smallest when the gap $g_{AF}$ is established.

Figure 32:
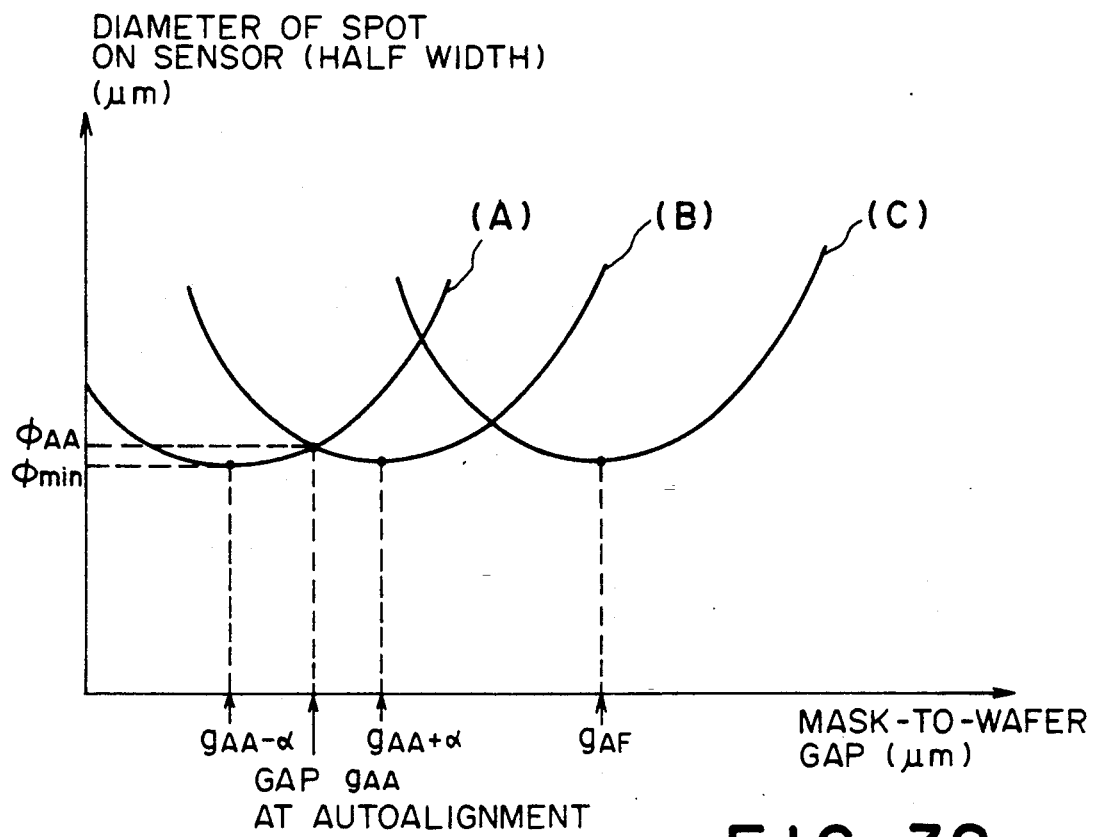
FIG. 32 illustrates the relationship between the mask-to-wafer spacing and the spot diameter, in the FIG. 30 embodiment.

In regard to the manner of change in the diameter of diffraction light spot on the sensor 4 or 5 with the spacing between the mask and the wafer, many variations are possible. An example is illustrated in FIG. 32. When, for example, a mask and a wafer are equipped with combinations of patterns, providing three detection systems A, B and C and if the autoalignment is made through the detection systems A and B while the autofocusing (gap measurement) is made through the detection systems B and C, as seen from FIG. 32, the detection system A may have a combined power of a convex-concave system or a concave-convex system, with a minimum spot being provided by a spacing $g_{AA} - \alpha$; the detection system B may have a combined power of a concave-convex system or a convex-concave system, with a minimum spot being provided by a spacing $g_{AA} + \alpha$; and the detection system C may be any one of a convex-concave system and a concave-convex system, with a minimum spot being provided by a spacing $g_{AF}$. Here, the autoalignment is made at a set gap $g_{AA}$. The value $\alpha$ may be such by which the spot at the time of autoalignment is not defocused greatly.

Here, depending on the value of the spacing, it is possible to measure the spacing on the basis of the magnitude of defocus of each of the three spots (i.e. spot size) formed by the three pattern combinations of the detection systems A, B and C. Therefore, it is possible to detect the spacing between the mask and the wafer, at higher precision.

Figure 33:
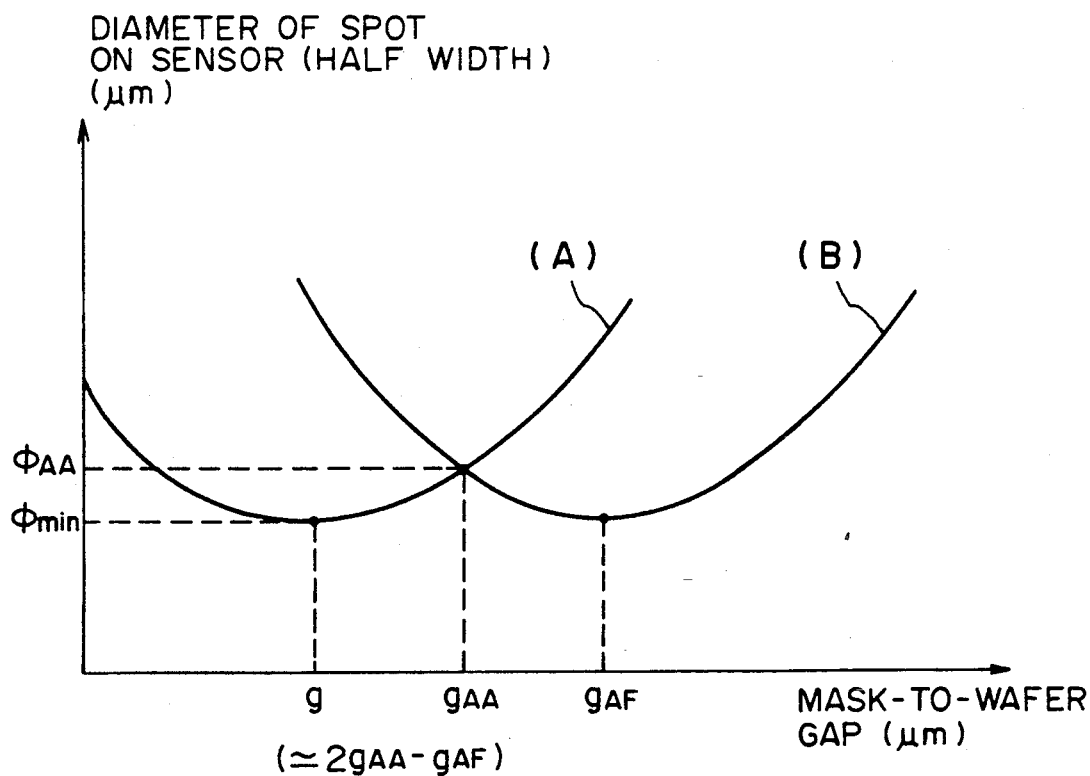
FIG. 33 illustrates the relationship between a mask-to-wafer spacing and a spot diameter, to be assumed in a twelfth embodiment of the present invention.

As an alternative, when a mask and a wafer are equipped with two sets of patterns which are used to provide detection systems A and B, the setting may be made so that the spot diameter of a sensor changes with the spacing between the mask and the wafer, in a manner as shown in FIG. 33: wherein the detection system A may have a combined power of a convex-concave system or a concave-convex system, with a minimum spot being provided by a spacing near "$2g_{AA} - 2g_{AF}$"; and the detection system B may have a combined power of a concave-convex system or a convex-concave system, with a minimum spot being provided by a spacing $g_{AF}$. Any positional deviation (alignment error) between the mask and the wafer can be detected on the basis of the spacing between a spot on a sensor formed by the pattern combination of the detection system A and a spot on a sensor formed by the pattern combination of the detection system B. On the other hand, the spacing between the mask and the wafer can be detected on the basis of the size of the spot on the sensor formed by the pattern combination of the detection system A as well as the size of the spot on the sensor formed by the pattern combination of the detection system B. As described, in this embodiment, it is possible to detect both the positional deviation and the spacing, by using two lights.

In regard to the setting of pattern areas on a mask and a wafer, in addition to the example shown in FIG. 23, there are many possible variations of the manner of division thereof.

Figure 34:
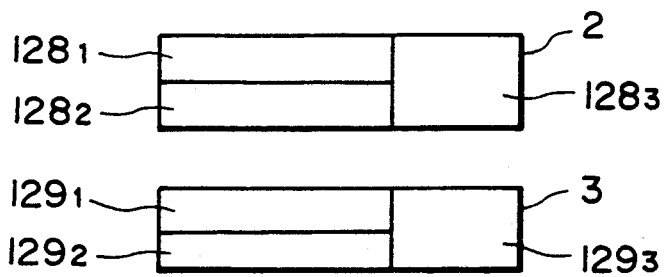
FIG. 34 illustrates an example of a pattern area which is usable in each of the ninth, tenth and eleventh embodiments.

An example is illustrated in FIG. 34. In this Figure, a set of FZP patterns $128_1$ and $129_1$; a set of FZP patterns $128_2$ and $129_2$; and a set of FZP patterns $128_3$ and $129_3$ provide detection systems, respectively, producing respective spots.

In respect to some embodiments above, description has been made to examples wherein a mask and a wafer are brought into alignment with each other while being maintained in a proximity relationship, such as in the case of an X-ray stepper. However, the invention is not limited to this, and it is applicable also to a stepper which uses ultraviolet light or an excimer laser or a reduction imaging type exposure apparatus that uses mirrors, for example.

Figure 35:
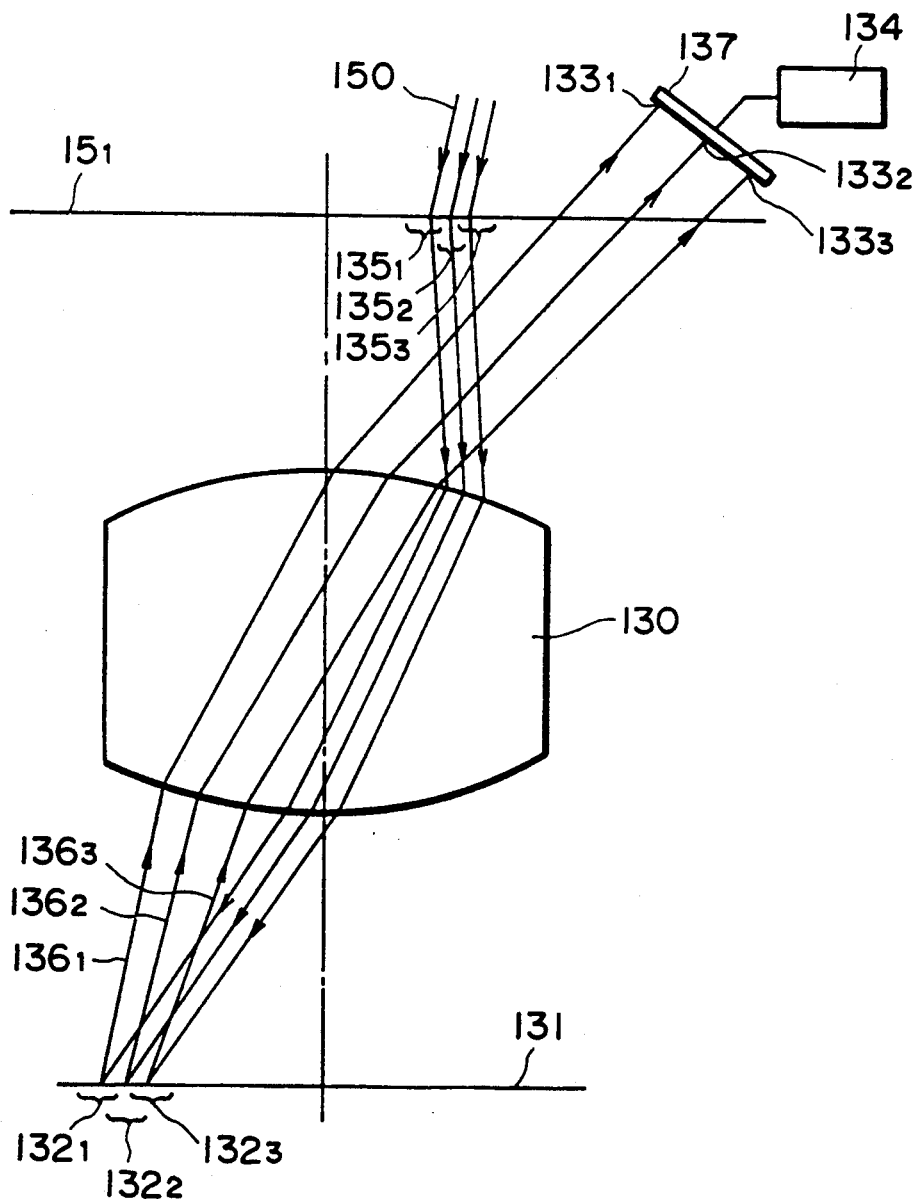
FIG. 35 is a schematic representation of an apparatus according to a thirteenth embodiment of the present invention.

FIG. 35 is a schematic view of one embodiment wherein the invention is applied to a stepper that uses ultraviolet light or an excimer laser. In this Figure, denoted at 150 is a pattern illuminating light. Numerals $135_1$, $135_2$ and $135_3$ denote patterns provided on a reticle 151 for an alignment and autofocusing purpose. Numeral 130 denotes an imaging lens by which the reticle 151 and a wafer 131 are brought into an optically conjugate relationship. In this embodiment, diffraction lights $136_1$, $136_2$ and $136_3$ from alignment patterns $132_1$, $132_2$ and $132_3$ on the wafer 131 go through the imaging lens 130 and are received by a sensor 137. The spacings of the thus produced spots $133_1$, $133_2$ and $133_3$ as well as the spot size thereof are detected by a processing system 134. By this, any positional deviation (alignment error) between the reticle and the wafer in a plane as well as any relative deviation therebetween in the direction of the optical axis of the imaging lens 130, can be detected. If, on this occasion, the imaging lens 130 shows chromatic aberration with respect to the used light 150, the patterns of the Fresnel zone plates $135_1$, $135_2$ and $135_3$ and the patterns of the Fresnel zone plates $132_1$, $132_2$ and $132_3$ on the wafer are set in consideration of this.

Figure 36:
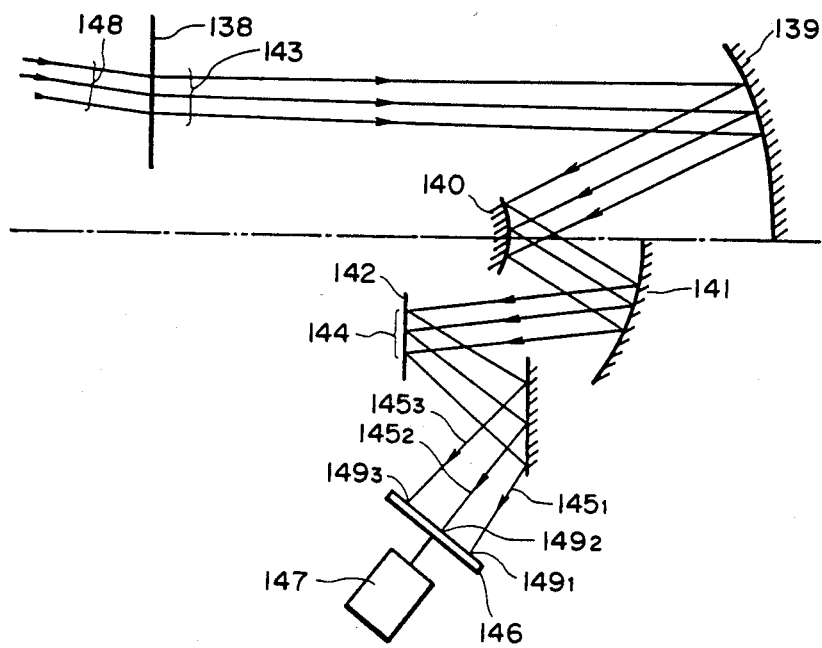
FIG. 36 is a schematic view of an apparatus according to a fourteenth embodiment of the present invention.

FIG. 36 is a schematic view of one embodiment wherein the invention is applied to a reduction type stepper, using mirrors. In this example, a pattern 143 on a reticle 138 surface and a pattern 144 on a wafer 142 surface are used in the manner described with reference to the foregoing embodiments, to detect the spacing and size of spots $149_1$, $149_2$ and $149_3$ on a line sensor or area sensor 146 to detect any positional deviation between the reticle 138 and the wafer 142 as well as any relative deviation therebetween in the direction of an optical axis of the optical arrangement constituted by mirrors 139, 140 and 141.

Also, in the embodiments shown in FIGS. 35 and 36, the sensor may not be disposed at the illustrated plane but, in place thereof, a relay lens may be disposed at that position and the sensor may be placed in the imaging plane of the lens.

Figure 1:
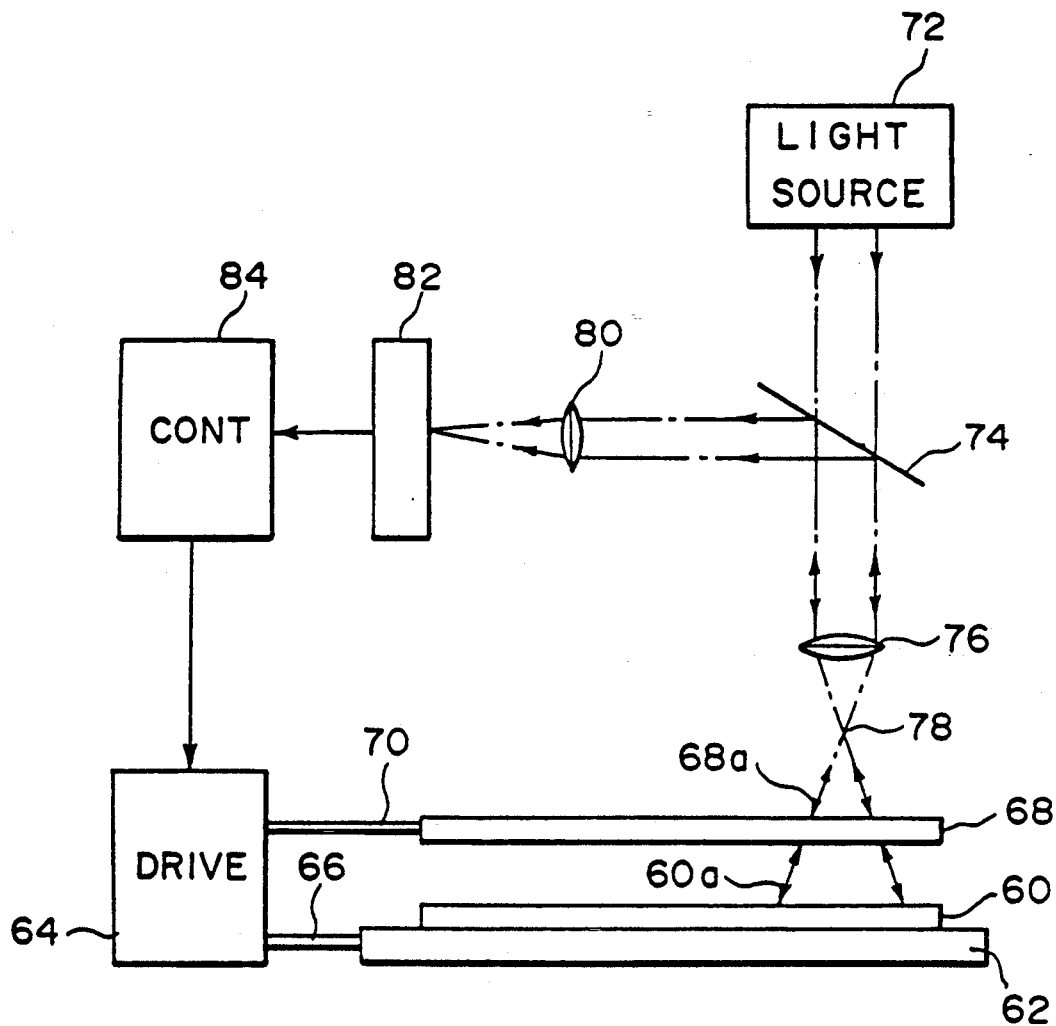
FIGS. 1 and 2 illustrate a known type alignment system.
Figure 2:
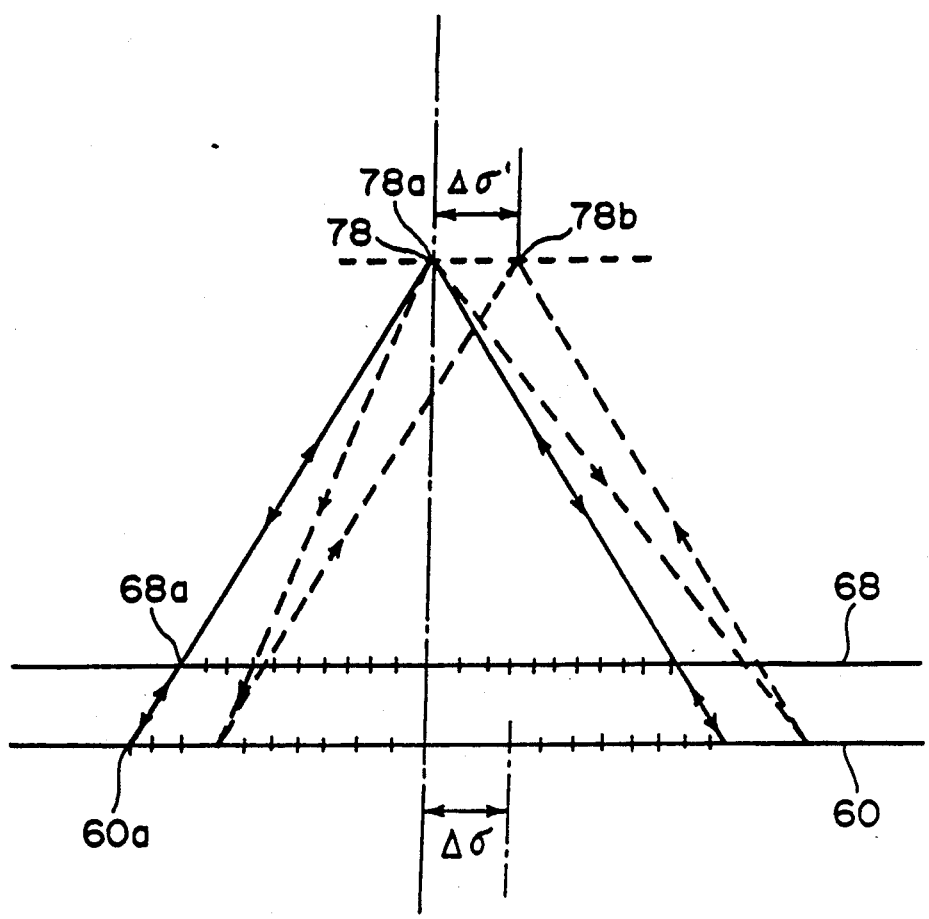
Figure 3:
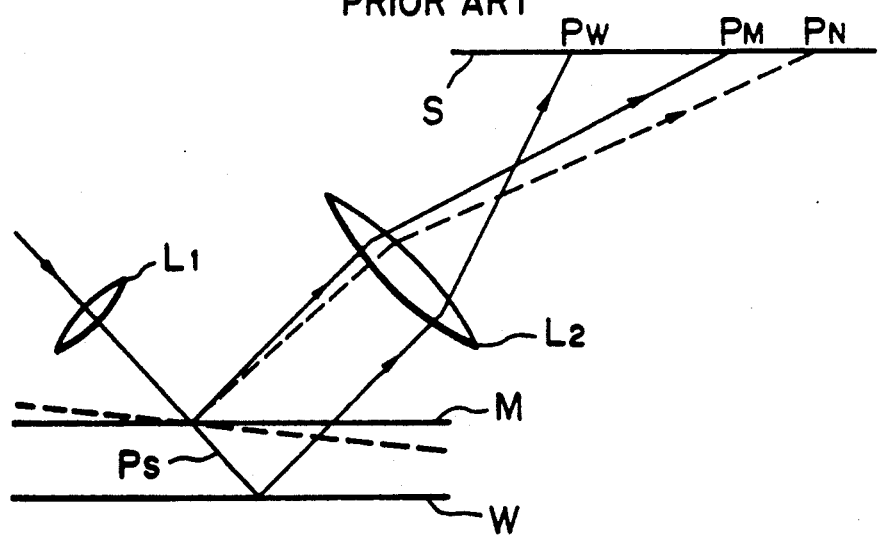
FIG. 3 illustrates a known type interval measuring device.
Figure 37A:
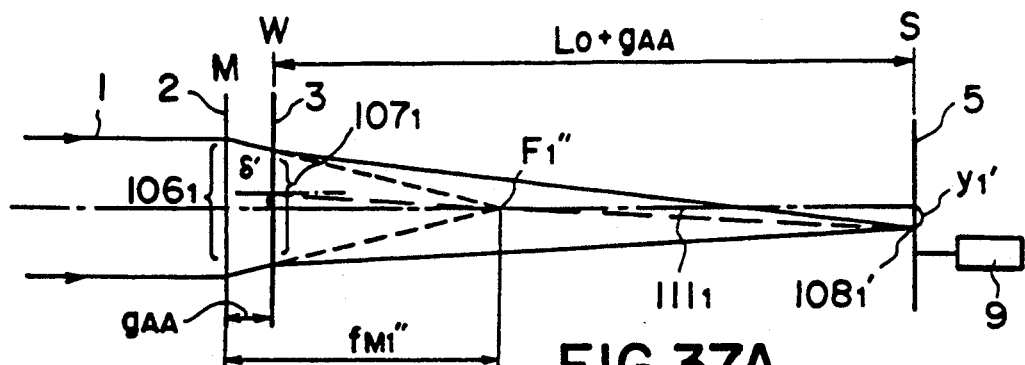
FIGS. 37A, 37B, 38A and 38B are schematic representations, respectively, illustrating modified forms of the ninth embodiment, wherein the optical paths are shown in unfolded views.
Figure 37B:
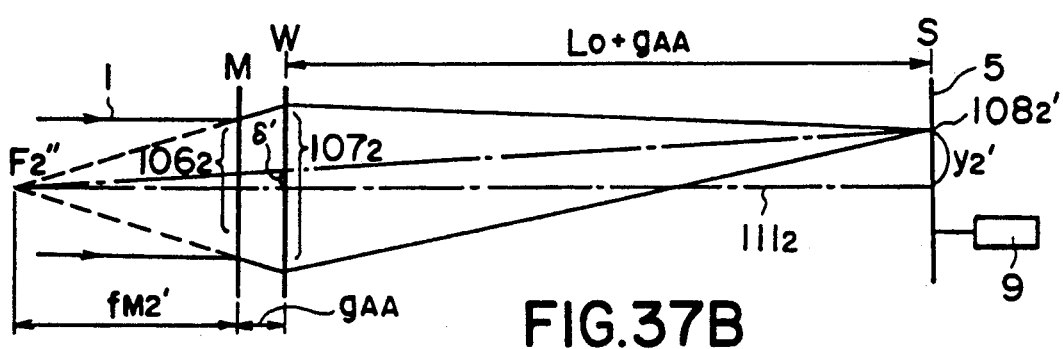

FIG. 37 shows a modified form of the FIG. 20 embodiment. In this example, the combination of patterns $106_1$ and $107_1$; $106_2$ and $107_2$ shown in part (A) and (B) of FIG. 2, is used as it is and the alignment error is detected essentially in the same principle as of the FIG. 20 embodiment. On the other hand, the spacing between the mask and the wafer is detected only by using the diameter of a spot $108_2$, singly, on a sensor 4. The relationship between the mask-and-wafer spacing and the spot diameter on the sensor, based on the combination of patterns $106_2$ and $107_2$, is such as illustrated in FIG. 24. By detecting this relationship in preparation, it is possible to detect the mask-and-wafer spacing from the spot diameter.

Figure 38A:
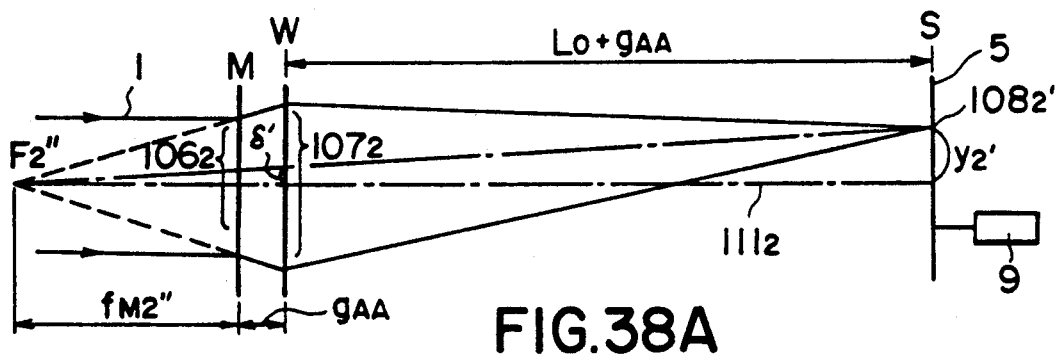
Figure 38B:
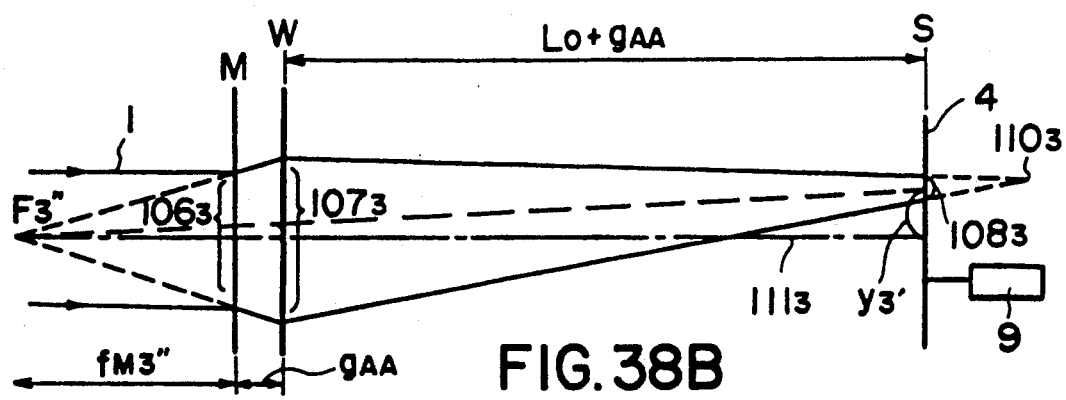

FIG. 38 shows another modified form of the FIG. 20 embodiment. In this example, the combination of patterns $106_2$ and $107_2$; $106_3$ and $107_3$ illustrated in parts (B) and (C) of FIG. 20, is used as it is and the mask-and-wafer spacing is detected essentially in the same principle as of the FIG. 20 embodiment. In contrast, with regard to the alignment error between the mask and the wafer, in this example, it is detected on the basis of the position of a spot $108_2$ on a sensor 4. This will be explained below.

As a mask is initially set in an apparatus, a reference position of the spot 1082 (i.e. the position thereof as assumed when the mask and the wafer have no relative positional deviation and they are set at a correct spacing $g_{AA}$) is determined. This can be done by trial printing, for example. In the actual position detecting operation, first the spacing between the mask and the wafer is measured in accordance with the principle described hereinbefore, and, thereafter, any error in the spacing is corrected to set the mask and the wafer at the correct spacing. Then, any deviation of the spot $108_2$ at that time from its reference position is measured to obtain $y_2$. Since values $L_0$ and $f_{M2}''$ are predetected, from equation (5''') it is possible to obtain the deviation $\delta'$.

In accordance with these embodiments, as described hereinbefore, for detection of relative positional deviation and surface spacing between first and second objects, a plurality of physical optic elements are provided on the first and second objects in a manner that a part thereof are used in common and, additionally, diffraction lights of a predetermined order or orders, not lower than a first or second order, from these physical optic elements are used. This provides the following advantageous effects:

(a) Since a part of the physical optic elements is used in common for the detection of positional deviation and the detection of surface spacing, only a small area is required for the pattern setting.

(b) Since the positional deviation and the surface spacing can be detected with one light, the device as a whole can be made compact.

(c) No error results from any inclination of the second object (wafer) or from an error in the setting of the detecting system. Therefore, high-detection is attainable.

(d) The positional deviation and the surface spacing can be detected simultaneously.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting a relative position of, and a gap between, opposed first and second substrates, wherein the first substrate is provided with a first pattern having a positive power and a second pattern having a negative power, while the second substrate is provided with a first mark having a negative power and a second mark having a positive power, said method comprising the steps of:
    projecting a radiation beam to the first and second substrates to form a first beam pattern on a predetermined plane with the first pattern and the first mark, while a second beam pattern is formed on the predetermined plane with the second pattern and the second mark;
    determining the relative position of the first and second substrates on the basis of an interval between the first and second beam patterns formed on the predetermined plane; and
    determining the gap between the first and second substrates on the basis of the position of the first beam pattern on the predetermined plane.

2. A method of detecting a relative position of, and a gap between, opposed first and second substrates, wherein the first substrate is provided with a first pattern having a positive power and a second pattern having a negative power, while the second substrate is provided with a first mark having a negative power and a second mark having a positive power, said method comprising the steps of:
    projecting a radiation beam to the first and second substrates to form a first beam pattern on a predetermined plane with the first pattern and the first mark, while a second beam pattern is formed on the predetermined plane with the second pattern and the second mark;
    determining the relative position of the first and second substrates on the basis of an interval between the first and second beam patterns formed on the predetermined plane; and
    determining the gap between the first and second substrates on the basis of the size of the first beam pattern on the predetermined plane.

3. A method according to claim 2, further comprising determining the gap between the first and second substrates on the basis of the size of each of the first and second beam patterns on the predetermined plane.

4. A method of detecting a relative position of, and a gap between, opposed first and second substrates, wherein the first substrate is provided with first and second patterns each having a positive power, while the second substrate is provided with first and second marks having a negative power, said method comprising the steps of:
    projecting a radiation beam to the first and second substrates to form a first beam pattern on a predetermined plane with the first pattern and the first mark, while a second beam pattern is formed on the predetermined plane with the second pattern and the second mark;
    determining the gap between the first and second substrates on the basis of an interval between the first and second beam patterns formed on the predetermined plane; and
    determining the relative position of the first and second substrates on the basis of the position of the first beam pattern on the predetermined plane.

5. A method of detecting a relative position of, and a gap between, opposed first and second substrates, wherein the first substrate is provided with first and second patterns each having a positive power, while the second substrate is provided with first and second marks each having a negative, said method comprising the steps of:
    projecting a radiation beam to the first and second substrates to form a first beam pattern on a predetermined plane with the first pattern and the first mark, while a second beam pattern is formed on the predetermined plane with the second pattern and the second mark;
    determining the gap between the first and second substrates on the basis of the size of each of the first and second beam patterns formed on the predetermined plane; and
    determining the relative position of the first and second substrates on the basis of the position of the first beam pattern on the predetermined plane.

6. A method of detecting a relative position of, and a gap between, opposed first and second substrates, wherein the first substrate is provided with first and second patterns each having an optical power, while the second substrate is provided with a mark having an optical power and a reflection surface, said method comprising the steps of:
    projecting a radiation beam to the first and second substrates to form a first beam pattern on a predetermined plane with the first pattern and the mark, while a second beam pattern is formed on the predetermined plane with the second pattern and the reflection surface;
    determining the relative position of the first and second substrates on the basis of the position of the first beam pattern formed on the predetermined plane; and
    determining the gap between the first and second substrates on the basis of the size of each of the first and second beam patterns on the predetermined plane.

7. A method of detecting a gap between, and a relative position of, opposed first and second substrates, wherein the first substrate is provided with a first pattern having an optical power and the second substrate is provided with a second pattern having an optical power, said method comprising the steps of:
    directing a radiation beam to the first and second substrates to irradiate the first and second patterns, such that first and second beam patterns are respectively formed on a predetermined plane under the influence of the optical powers of the first and second patterns; and detecting the relative position of, and the gap between, the first and second substrates on the basis of the first and second beam patterns formed on the predetermined plane, wherein at least one of the first and second beam patterns is used both for the detection of the relative position and for the detection of the gap.

8. A method according to claim 7, wherein said detecting step comprises using positional information related to the first and second beam patterns.

9. A method according to claim 8, wherein the relative position of the first and second substrates is detected on the basis of the spacing between the first and second beam patterns and wherein the gap between the first and second substrates is detected on the basis of the position of the first beam pattern.

10. A method according to claim 8, wherein the gap between the first and second substrates is detected on the basis of the spacing between the first and second beam patterns and wherein the relative position of the first and second substrates is detected on the basis of the position of the first beam pattern.

11. A method according to claim 8, wherein the relative position of the first and second substrates is detected on the basis of the spacing between the first and second beam patterns and wherein the gap between the first and second substrates is detected on the basis of the size of the first beam pattern.

12. A method according to claim 11, wherein the relative position of the first and second substrates is detected on the basis of the spacing between the first and second beam patterns and wherein the gap between the first and second substrates is detected on the basis of the size of each of the first and second beam patterns.

13. A method according to claim 8, wherein said directing step further comprises forming a third beam pattern on the predetermined plane under the influence of the optical powers of the first and second patterns, respectively, and wherein said detecting step uses at least one of the size and position of the third beam pattern.

14. A method according to claim 13, wherein the relative position of the first and second substrates is detected on the basis of the spacing between the first and second beam patterns and wherein the gap between the first and second substrates is detected on the basis of the spacing between the first and third beam patterns.

15. A method according to claim 13, wherein the gap between the first and second substrates is detected on the basis of the size of each of the first and third beam patterns.

16. A method according to claim 15, wherein the gap between the first and second substrates is detected on the basis of the size of each of the first through third beam patterns.

17. A method according to claim 7, wherein each of the first and second patterns include a zone plate.

18. A method according to claim 17, wherein the first pattern includes first and second marks, the second pattern includes third and fourth marks, and further comprising forming the first beam pattern by the first and third marks and forming the second beam pattern by the second and fourth marks.

19. A method according to claim 18, wherein at least one of the first and second patterns includes a fifth mark having an optical power, and wherein said directing step further comprises forming a third beam pattern on the predetermined plane under the influence of the optical power of the fifth mark, and wherein the gap between the first and second substrates is detected on the basis of at least one of the size and position of the third beam pattern.

20. A method according to claim 19, further comprising providing each of the first and second substrates with the fifth mark.

21. A method according to claim 7, wherein the first substrate includes a mask while the second substrate includes a semiconductor wafer, both for use in manufacturing semiconductor devices.

* * * * *

UNITED STATES PATENT AND TRADEMARK OFFICE
CERTIFICATE OF CORRECTION

PATENT NO. : 5,148,038
DATED : September 15, 1992
INVENTOR(S) : Noriyuki Nose, et al.

It is certified that error appears in the above-identified patent and that said Letters Patent is hereby corrected as shown below:

COLUMN 1

Line 39, "a method" should read --is a method--.

COLUMN 5

Line 49, "relatively" should read --relative--.

COLUMN 6

Line 39, "$fM_2$" should read --$F_{M2}$--.

COLUMN 9

Line 27, "$|(M-N)/(M+N)<<1.$" should read --$|(M-N)/(M+N)|<<1.$--.

COLUMN 10

Line 37, "plate" should read --plates--.

UNITED STATES PATENT AND TRADEMARK OFFICE
CERTIFICATE OF CORRECTION

PATENT NO. : 5,148,038
DATED : September 15, 1992
INVENTOR(S) : Noriyuki Nose, et al.

It is certified that error appears in the above-identified patent and that said Letters Patent is hereby corrected as shown below:

COLUMN 12

Line 27, "sots 16," should read --spots 16,--;

Line 54, "Reference the $20_1$," should read

--Reference numerals $20_1$,--;

Equation (7), "$g1 = \dfrac{L_0 + g_m}{f_{M1} + g_m} (\epsilon_1 + \hat{\Delta}_1) + \hat{\Delta}_1 \qquad (7)$"

should read

--$g_1 = \dfrac{L_0 + g_m}{\hat{f}_{M1} + g_m} (\epsilon_1 + \hat{\Delta}_1) + \hat{\Delta}_1 \qquad (7)$--;

Line 65, "$f_{M2}$" in the denominator of Equation (8) should read --$\hat{f}_{M2}$--; and

COLUMN 13

Line 2, "$f_{M3}$" in the denominator of Equation (9) should read --$\hat{f}_{M3}$--; and Line 21, "are" should read --is--.

UNITED STATES PATENT AND TRADEMARK OFFICE
CERTIFICATE OF CORRECTION

PATENT NO. : 5,148,038

DATED : September 15, 1992

INVENTOR(S) : Noriyuki Nose, et al.

It is certified that error appears in the above-identified patent and that said Letters Patent is hereby corrected as shown below:

COLUMN 17

Line 49, "of" should be deleted.

COLUMN 18

Line 22, "is" should read --are--.

COLUMN 19

Line 44, "onehundred" should read --one hundred--;
    Line 51, "one-hundred" should read --one hundred--;
    Line 55, the right margin should be closed; and
    Line 56, the left margin should be closed.

COLUMN 20

Line 9, "$f_{MS}$" = 155.62 microns." should read --$f_{M2}$" = 155.62 microns.--.

COLUMN 21

Line 5, "as" should read --a--.

UNITED STATES PATENT AND TRADEMARK OFFICE
CERTIFICATE OF CORRECTION

PATENT NO. : 5,148,038
DATED : September 15, 1992
INVENTOR(S) : Noriyuki Nose, et al.

It is certified that error appears in the above-identified patent and that said Letters Patent is hereby corrected as shown below:

COLUMN 23

Line 17, "$y_2$," should read --$\Delta y2$,--; and
Line 20, "error $\Delta\flat$," should read --error $\Delta\theta$.--.

COLUMN 28

Line 24, "negative," should read --negative power,--.

COLUMN 30

Line 19, "include" should read --includes--.

Signed and Sealed this

Second Day of November, 1993

Attest:

BRUCE LEHMAN

Attesting Officer

Commissioner of Patents and Trademarks